United States Patent
Ausserlechner

(10) Patent No.: US 10,247,788 B2
(45) Date of Patent: Apr. 2, 2019

(54) RESISTIVE ELEMENT

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 385 days.

(21) Appl. No.: 15/078,402

(22) Filed: Mar. 23, 2016

(65) Prior Publication Data

US 2016/0245880 A1  Aug. 25, 2016

Related U.S. Application Data

(62) Division of application No. 13/932,718, filed on Jul. 1, 2013, now Pat. No. 9,322,840.

(51) Int. Cl.
*G01R 33/07* (2006.01)
*G01P 15/12* (2006.01)
*G01R 33/00* (2006.01)

(52) U.S. Cl.
CPC ............ *G01R 33/07* (2013.01); *G01P 15/123* (2013.01); *G01R 33/0052* (2013.01)

(58) Field of Classification Search
CPC ............................. G01P 15/123; G01R 33/07
See application file for complete search history.

(56) References Cited

U.S. PATENT DOCUMENTS 6,906,514 B2  6/2005  Ausserlechner
7,302,357 B2  11/2007  Ausserlechner et al.
7,437,260 B2  10/2008  Ausserlechner et al.
(Continued)

FOREIGN PATENT DOCUMENTS

DE  102004034277 A1  2/2006
DE  102005008724 A1  9/2006
DE  102009015965 A1  10/2009

OTHER PUBLICATIONS

Ausserlechner, et al. "Compensation of the Piezo-Hall Effect in Integrated Hall Sensors on (100)-Si", IEEE Sensors Journal, vol. 7, No. 11, Nov. 2007.
(Continued)

*Primary Examiner* — Huy Q Phan
*Assistant Examiner* — Adam Clarke
(74) *Attorney, Agent, or Firm* — Eschweiler & Potashnik, LLC

(57) ABSTRACT

A resistive element includes a resistive region in a semiconductor substrate, a first contact structure and a second contact structure. The semiconductor substrate includes a first main surface area. The resistive region extends in a lateral direction parallel to the main surface area and in a vertical direction perpendicular to the main surface area, and includes a first piezo-resistive coefficient for a current flow in the lateral direction and a second piezo-resistive coefficient for a current flow in the vertical direction. The first contact structure contacts a portion of a first face of the resistive region and the second contact structure contacts a portion of a second face of the resistive region. The resistive element generates a current flow distribution within the resistive region having a lateral component and a vertical component that results in a piezo-resistive coefficient of the resistive element.

19 Claims, 9 Drawing Sheets

(56) References Cited

U.S. PATENT DOCUMENTS

| | | |
|---|---|---|
| 7,440,861 B2 | 10/2008 | Ausserlechner et al. |
| 7,750,743 B2 | 7/2010 | Ausserlechner et al. |
| 7,980,138 B2 | 7/2011 | Ausserlechner |
| 8,240,218 B2 | 8/2012 | Ausserlechner et al. |
| 2002/0021126 A1 | 2/2002 | Ishibashi |
| 2005/0161749 A1* | 7/2005 | Yang .................... B81B 3/0035 257/414 |
| 2008/0238410 A1 | 10/2008 | Charlier |
| 2010/0123458 A1* | 5/2010 | Schott .................... G01R 33/06 324/251 |
| 2010/0133632 A1 | 6/2010 | Schott |
| 2010/0252900 A1 | 10/2010 | Minixhofer |
| 2012/0056609 A1* | 3/2012 | Satoh ...................... G05F 3/30 323/313 |
| 2012/0286776 A1 | 11/2012 | Ausserlechner et al. |
| 2013/0021026 A1 | 1/2013 | Ausserlechner |
| 2013/0021027 A1 | 1/2013 | Ausserlechner |
| 2014/0009221 A1 | 1/2014 | Motz et al. |

OTHER PUBLICATIONS

Notice of Allowance dated Dec. 28, 2015 U.S. Appl. No. 13/932,718.

* cited by examiner

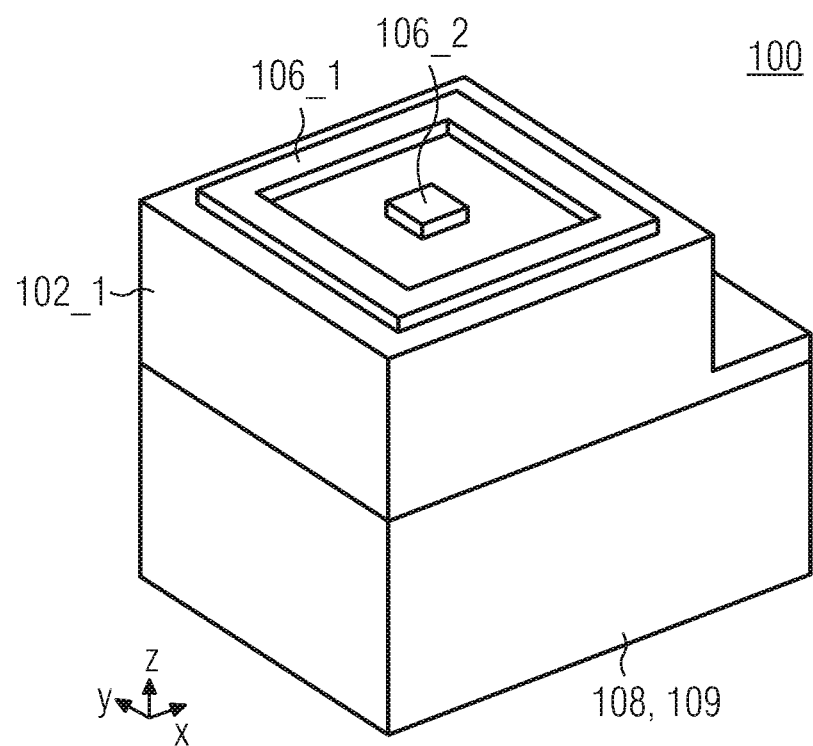

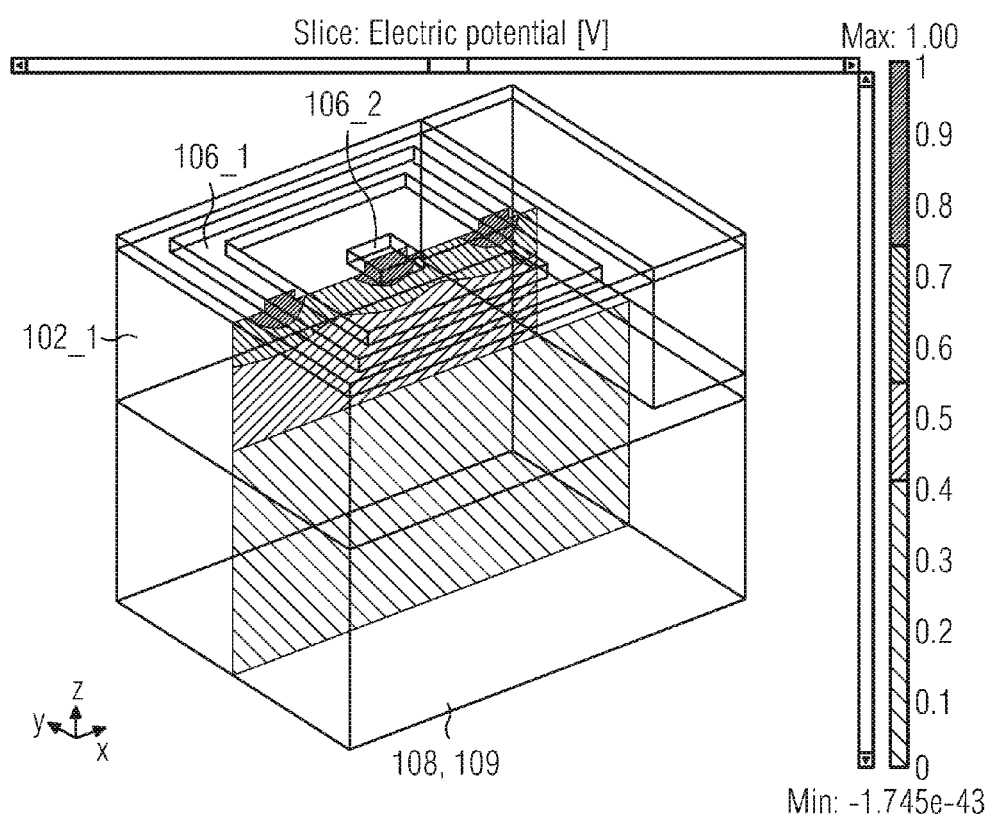

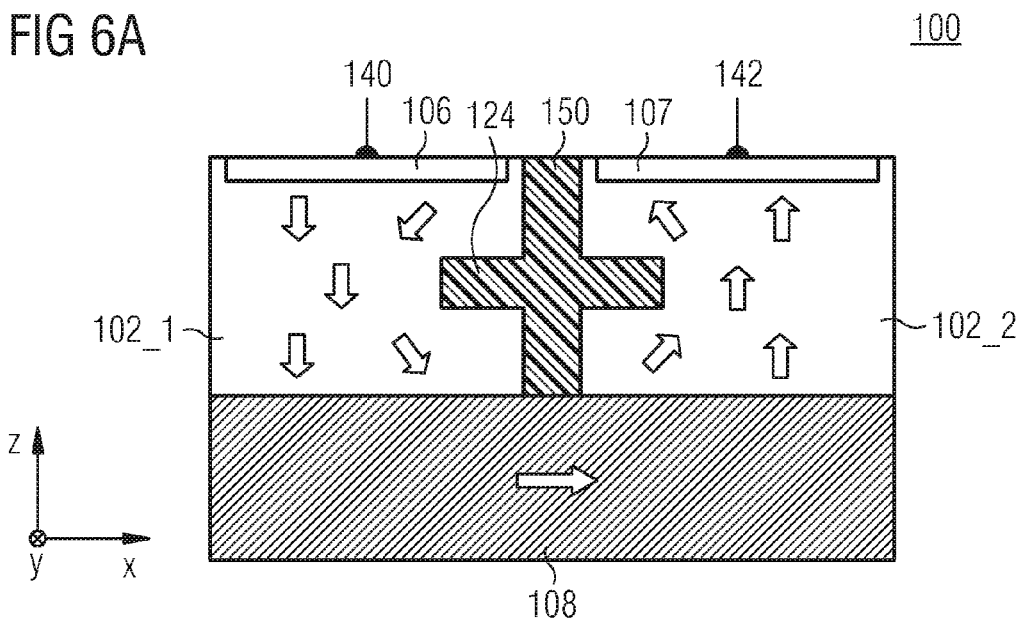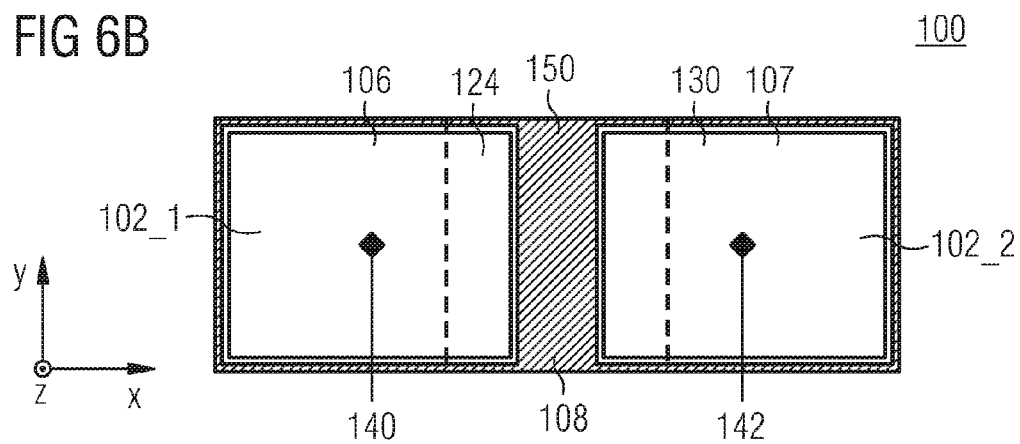

RESISTIVE ELEMENT

REFERENCE TO RELATED APPLICATION

This application is a divisional of U.S. application Ser. No. 13/932,718 filed on Jul. 1, 2013, the contents of which are incorporated by reference in their entirety.

FIELD

The disclosure relates to a resistive element having a specific piezo-resistive coefficient and to a method for operating the same.

BACKGROUND

It is known that the current related magnetic sensitivity of Hall plates in (100)-silicon is affected by mechanical stress according to the equation $$S_i(T,\sigma) = S_i(T,0) \cdot (1 + P_{n,Hall}(T)\sigma),$$

wherein $$P_{n,Hall} = P_{12} = 45\%/Gpa$$

is the piezo-Hall effect, and a the sum of the principal stress components in the surface of the die.

The total magnetic sensitivity of a Hall plate is $$S = \frac{\partial V_{out}}{\partial B_Z} = S_i \cdot I$$

with I being the current through the Hall plate, $V_{out}$ the output voltage of the Hall plate and $B_Z$ the magnetic induction perpendicular to the Hall plate and acting on the Hall plate.

If the current through the Hall plate is also generated on the same silicon die, it is also affected by the same mechanical stress, particularly if the current generator is placed close to the Hall plate.

SUMMARY

A resistive element having a specific piezo-resistive coefficient is provided according to one embodiment. The resistive element comprises a resistive region formed in a semiconductor substrate, a first contact structure and a second contact structure. The semiconductor substrate comprises a first main surface area. The resistive region extends in a lateral direction parallel to the main surface area and in a vertical direction perpendicular to the main surface area, is isolated from the semiconductor substrate in the lateral direction and comprises for a (specific) stress component a first piezo-resistive coefficient for a current flow in the lateral direction and a second piezo-resistive coefficient, different from the first piezo-resistive coefficient, for a current flow in the vertical direction. The first contact structure is arranged to contact at least a portion of a first face of the resistive region parallel to the main surface area and positioned at a first distance to the main surface area. The second contact structure is arranged to contact at least a portion of a second face of the resistive region different from the first face, parallel to the main surface area and positioned at a second distance to the main surface area different from the first distance. The resistive element is adapted to generate, in response to an input signal applied to at least one of the first contact structure and second contact structure, a (total) current flow distribution within the resistive region between the first contact structure and the second contact structure having a lateral component (or proportion) and a vertical component (or proportion), wherein a combination of the lateral component and the vertical component results in a piezo-resistive coefficient of the resistive element which is defined by the ratio between the lateral component in the lateral direction in the resistive region having the first piezo-resistive coefficient for the current flow in the lateral direction and the vertical component in the vertical direction in the resistive region having the second piezo-resistive coefficient for the current flow in the vertical direction. Thereby, the resistive element is configured such that a ratio between the lateral component and the vertical component is obtained within the resistive region which results in the specific piezo-resistive coefficient. Thereby, the specific piezo-resistive coefficient may have a value, for example, in the range between +3*10^(−10)/Pa and +6*10^(−10)/Pa times the sum of stress components parallel to the main surface area.

A resistive element having a specific piezo-resistive coefficient is provided according to another embodiment. The resistive element comprises a resistive region formed in a semiconductor substrate, a first contact structure and a second contact structure. The semiconductor substrate comprises a first main surface area. The resistive region extends in a first lateral direction parallel to the main surface area, in a second lateral direction different from the first lateral direction and parallel to the main surface area, and in a vertical direction perpendicular to the main surface area, is isolated from the semiconductor substrate in the lateral directions and comprises for a (specific) stress component a first piezo-resistive coefficient for a current flow in the first lateral direction, a third piezo-resistive coefficient for a current flow in the second lateral direction and a second piezo-resistive coefficient, different from the first piezo-resistive coefficient and the third piezo-resistive coefficient, for a current flow in the vertical direction. The first contact structure is arranged to contact at least a portion of a first face of the resistive region parallel to the main surface area and positioned at a first distance to the main surface area. The second contact structure is arranged to contact at least a portion of a second face of the resistive region different from the first face, parallel to the main surface area and positioned at a second distance to the main surface area different from the first distance. The resistive element is adapted to generate, in response to an input signal applied to at least one of the first contact structure and the second contact structure, a (total) current flow distribution within the resistive region between the first contact structure and the second contact structure having a first lateral component (or proportion), a second lateral component (or proportion) and a vertical component (or proportion), wherein a combination of the first lateral component, the second lateral component and the vertical component results in a piezo-resistive coefficient which is defined by the ratio between the first lateral component in the first lateral direction in the resistive region having the first piezo-resistive coefficient for the current flow in the first lateral direction, the second lateral component in the second lateral direction in the resistive region having the third piezo-resistive coefficient for the current flow in the second lateral direction, and the vertical component in the vertical direction in the resistive region having the second piezo-resistive coefficient for the current flow in the vertical direction. Thereby, the resistive element is configured such that a ratio between the first lateral component, the second lateral component, and the vertical component is obtained within the resistive region which results in the specific piezo-resistive coefficient. Thereby, the specific piezo-resistive coefficient may have a value, for example, in the range between +3*10^(−10)/Pa and +6*10^(−10)/Pa times the sum of stress components parallel to the main surface area.

A resistive element having a specific piezo-resistive coefficient provided according to yet another embodiment. The resistive element comprises a first resistive region and a second resistive region formed in a semiconductor substrate, a first contact structure, a second contact structure, a third contact structure and a fourth contact structure. The semiconductor substrate comprises a first main surface area. The first resistive region and the second resistive region extend in a lateral direction parallel to the main surface area and in a vertical direction perpendicular to the main surface area, are isolated from each other and from the semiconductor substrate in the lateral direction and comprise for a (specific) stress component a first piezo-resistive coefficient for a current flow in the lateral direction and a second piezo-resistive coefficient, different from the first piezo-resistive coefficient, for a current flow in the vertical direction. The first contact structure is arranged to contact at least a portion of a first face of the first resistive region parallel to the main surface area and positioned at a first distance to the main surface area. The second contact structure is arranged to contact at least a portion of a second face of the first resistive region different from the first face of the first resistive region, parallel to the main surface area and arranged at a second distance to the main surface area different from the first distance. The third contact structure is arranged to contact at least a portion of a first face of the second resistive region parallel to the main surface area and positioned at a third distance to the main surface area. The fourth contact structure is arranged to contact at least a portion of a second face of the second resistive region different from the first face of the second resistive region, parallel to the main surface area and positioned at a fourth distance to the main surface area different from the third distance. Thereby, the second contact structure and the fourth contact structure are connected to each other. The resistive element is adapted to generate, in response to an input signal applied to at least one of the first contact structure and second contact structure, a (total) current flow distribution within the first resistive region between the first contact structure and the second contact structure having a lateral component (or proportion) and a vertical component (or proportion), and to generate, in response to an input signal applied to at least one of the third contact structure and fourth contact structure, a (total) current flow distribution within the second resistive region between the third contact structure and the fourth contact structure having a lateral component (or proportion) and a vertical component (or proportion). A combination of the lateral components and the vertical components within the first resistive region and the second resistive region results in a piezo-resistive coefficient which is defined by the ratio between the lateral components in the lateral direction having the first piezo-resistive coefficient for the current flow in the lateral direction and the vertical components in the vertical direction having the second piezo-resistive coefficient for the current flow in the vertical direction. Thereby, the resistive element is configured such that a ratio between the lateral components and the vertical components is obtained within the first resistive region and the second resistive region which results in the specific piezo-resistive coefficient. Thereby, the specific piezo-resistive coefficient may have a value, for example, in the range between +3*10^(−10)/Pa and +6*10^(−10)/Pa times the sum of stress components parallel to the main surface area.

A resistive element is provided in still another embodiment. The resistive element comprises a resistive region formed in a semiconductor substrate and contacts. The semiconductor substrate comprises a main surface area and extends in a first lateral direction parallel to the main surface area, in a second lateral direction different from the first lateral direction and parallel to the main surface area, and in a vertical direction perpendicular to both of the first lateral direction and second lateral direction. The resistive region extends in at least one of the first lateral direction and second lateral direction between lateral boundaries, and in an out-of-plane direction between top and bottom boundaries, wherein the out-of-plane direction is different from all possible linear combinations of the first lateral direction and second lateral direction, wherein the resistive region is isolated along its lateral boundaries against the semiconductor substrate. The contacts are arranged at least at portions of the top and bottom boundaries of the resistive region. The resistive region comprises a first piezo-resistive coefficient for a current flow along the first lateral direction and a specific stress component and a second piezo-resistive coefficient for a current flow along the vertical direction and the same specific stress component. At least one of the contacts is configured to generate, in response to an input signal applied to the respective contact, a current vector field within the resistive region. The boundary conditions imposed on the current vector field inside the resistive region are such that the resistance between two the contacts comprises a piezo-resistive coefficient value between the values of the first piezo-resistive coefficient and the second piezo-resistive coefficient.

A method for generating a mechanical stress dependent signal with a resistive element is provided in still another embodiment. Thereby, the mechanical stress dependent signal comprises a specific mechanical stress dependency which is defined a specific piezo-resistive coefficient of the resistive element. The resistive element comprises a resistive region formed in a semiconductor substrate, a first contact structure and a second contact structure, wherein the semiconductor substrate comprises a first main surface area. The resistive region extends in a lateral direction parallel to the main surface area and in a vertical direction perpendicular to the main surface area, is isolated from the semiconductor substrate in the lateral direction and comprises for a (specific) stress component a first piezo-resistive coefficient for a current flow in the lateral direction and a second piezo-resistive coefficient, different from the first piezo-resistive coefficient, for a current flow in the vertical direction. The first contact structure is arranged to contact at least a portion of a first face of the resistive region parallel to the main surface area, wherein the second contact structure is arranged to contact at least a portion of a second face of the resistive region different from the first face and parallel to the main surface area. The method comprises applying an input signal to at least one of the first contact structure and second contact structure in order to generate a (total) current flow distribution within the resistive region between the first contact structure and the second contact structure having a lateral component and a vertical component, wherein a combination of the lateral component and the vertical component results in a piezo-resistive coefficient which is defined by the ratio between the lateral component in the lateral direction in the resistive region having the first piezo-resistive coefficient for the current flow in the lateral direction and the vertical component in the vertical direction in the resistive region having the second piezo-resistive coefficient for the current flow in the vertical direction. Thereby, the resistive element is configured such that a ratio between the lateral component and the vertical component is obtained within the resistive region which results in the specific piezo-resistive coefficient.

BRIEF DESCRIPTION OF THE DRAWINGS

Embodiments of the present disclosure are described herein making reference to the appended drawings.

FIG. 4 shows a three-dimensional cross-sectional view of the left half of the resistive element according to an embodiment;

FIG. 5(c) shows a three-dimensional cross-sectional view of the resistive element shown in FIG. 4 and a potential distribution within the resistive region in response to a signal applied to at least one of the first contact structure and the second contact structure;

FIG. 6(a) shows a cross-sectional view of a resistive element according to an embodiment;

FIG. 6(b) shows a top view of the resistive element shown in FIG. 6(a) according to an embodiment;

Figure 1A:
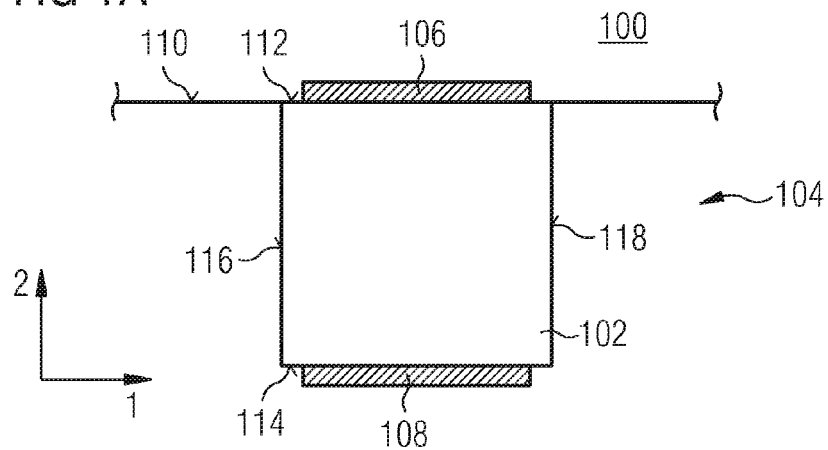
FIG. 1(a) shows a cross-sectional view of a resistive element according to an embodiment.

Equal or equivalent elements or elements with equal or equivalent functionality are denoted in the following description by equal or equivalent reference numerals.

DETAILED DESCRIPTION

In the following description, a plurality of details are set forth to provide a more thorough explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure.

In addition, features of the different embodiments described hereinafter may be combined with each other, unless specifically noted otherwise.

FIG. 1(a) shows a cross-sectional view of a resistive element 100 having a specific piezo-resistive coefficient $\pi_R$. The resistive element 100 comprises a resistive region 102 formed in a semiconductor substrate 104, a first contact structure 106 and a second contact structure 108.

The resistive region 102 can be of a single type of conductivity. For example, the single type of conductivity can be a n-type conductivity (e.g., n-doped) or a p-type conductivity (e.g., p-doped). Naturally, it is also possible that the resistive region 102 is both, p-doped and n-doped, wherein one of the two doping types dominates over the other (e.g., a weak background doping).

The resistive region 102 extends in a first direction parallel to a main surface area 110 of the semiconductor substrate 104 and in a second direction perpendicular to the main surface area 110, is isolated from the semiconductor substrate 104 in the first direction and comprises for a (specific) mechanical stress component a first piezo-resistive coefficient $\pi_{R1}$ for a current flow in the first direction and a second piezo-resistive coefficient $\pi_{R2}$, different from the first piezo-resistive coefficient $\pi_{R1}$, for a current flow in the second direction.

Note that a piezo-resistive coefficient can be defined as a change in resistance along a path in one direction divided by a change in mechanical stress. For example, the first piezo-resistive coefficient $\pi_{R1}$ may be defined as the change in electrical resistance along a path in the first direction divided by a change in mechanical stress. Similarly, the second piezo-resistive coefficient $\pi_{R2}$ may be defined as the change in electrical resistance along a path in the second direction divided by a change in mechanical stress.

The first contact structure 106 is arranged to contact at least a portion of a first face 112 of the resistive region 102 (substantially) parallel to the main surface area 110 and positioned at a first distance to the main surface area 110.

The second contact structure 108 is arranged to contact at least a portion of a second face 114 of the resistive region 102 different from the first face 112, (substantially) parallel to the main surface area 110 and positioned at a second distance to the main surface area 110 different from the first distance.

The resistive element 102 is adapted to generate, in response to an input signal applied to at least one of the first contact structure and second contact structure, a (total) current flow distribution within the resistive region 102 between the first contact structure 106 and the second contact structure 108 having a first component in the first direction and a second component in the second direction. A combination of the first component and the second component results in a piezo-resistive coefficient which is defined by the ratio between the first component in the first direction in the resistive region 102 having the first piezo-resistive coefficient $\pi_{R1}$ for the current flow in the first direction and the second component in the second direction in the resistive region 102 having the second piezo-resistive coefficient $\pi_{R2}$ for the current flow in the second direction.

In other words, the total piezo-resistive coefficient $\pi_R$ of the resistive element 100 may be in the range between first piezo-resistive coefficient $\pi_{R1}$ and the second piezo-resistive coefficient $\pi_2$, i.e. $\pi_R = \{\pi_{R1} \ldots \pi_{R2}\}$.

Thereby, the resistive element 102 is configured such that a ratio between the first component and the second component is obtained within the resistive region 102 which results in the specific piezo-resistive coefficient $\pi_R$.

Note that the resistive element 100 can be used for generating a mechanical stress dependent signal having a specific mechanical stress dependency, wherein the specific mechanical stress dependency is defined by the specific piezo-resistive coefficient $\pi_R$ of the resistive element 100.

For example, the mechanical stress dependent signal (e.g., current) generated by the resistive element 100 can be used to supply a Hall plate in order compensate the dependency of the magnetic sensitivity of the Hall plate on mechanical stress.

Thereby, mechanical stress may refer to a stress within the semiconductor substrate 102 which may arise, for example, due to temperature changes or even due to external forces applied to (the main surface area 110 of) the semiconductor substrate 104. In general, stress is a physical quantity that expresses the internal forces that neighboring particles of a continuous material, e.g., of the semiconductor substrate, exert on each other.

Figure 1B:
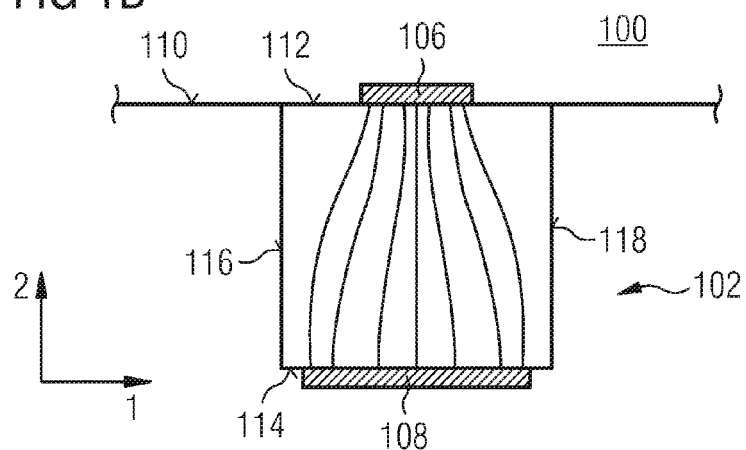
FIG. 1(b) shows a cross-sectional view of the resistive element according to a further embodiment.
Figure 1C:
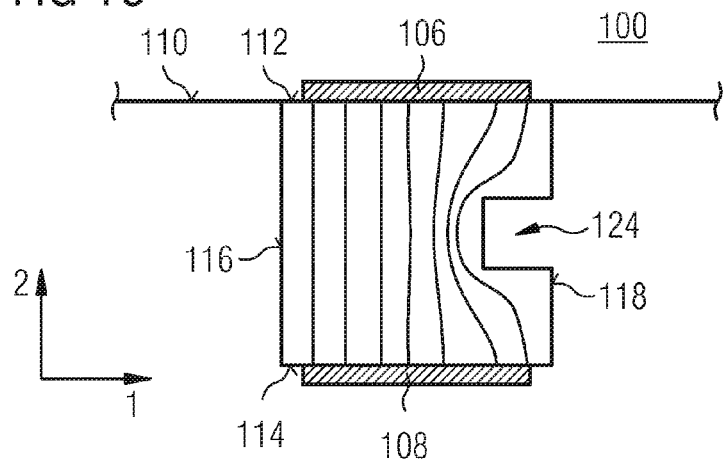
FIG. 1(c) shows a cross-sectional view of the resistive element according to a further embodiment.

Note that in FIGS. 1(a) to 1(c) a reference coordinate system having a first axis and a second axis, perpendicular to the first axis, is shown. Thereby, the first direction can be arranged parallel to or along the first axis of the reference coordinate system, wherein the second direction can be arranged parallel to or along the second axis of the reference coordinate system.

In the following, the first direction is referred to as a lateral direction and the second direction is referred to as a vertical direction (with respect to a normal or common orientation of the semiconductor substrate 104) by way of example only.

The semiconductor substrate 104 may be exposed to a plurality of mechanical stress components (e.g., a lateral stress component and/or a vertical stress component and/or in-plane (e.g., parallel to the main surface area 110 of the semiconductor substrate 104) or out-of-plane shear stress components). Thereby, the semiconductor substrate 104 may comprise for a specific mechanical stress component (or one mechanical stress component) of the plurality of mechanical stress components the first piezo-resistive coefficient $\pi_{R1}$ for the current flow in the lateral direction and the second piezo-resistive coefficient $\pi_{R2}$, different from the first piezo-resistive coefficient $\pi_{R1}$, for the current flow in the vertical direction.

Thereby, one current flow direction comprises not only one piezo-resistive coefficient, but rather each pair of current flow direction and stress component comprises one piezo-resistive coefficient. Thus, the specific stress component refers to the same stress component for both, the lateral current flow component and the vertical current flow component, and not to different stress components for the lateral current flow component and the vertical current flow component.

Therefore, the resistive element 100 may comprise for one specific stress component the first piezo-resistive coefficient $\pi_{R1}$ for the current flow in the lateral direction and for the same specific stress component the second piezo-resistive coefficient $\pi_{R2}$, different from the first piezo-resistive coefficient $\pi_{R1}$, for the current flow in the vertical direction.

In other words, the resistive element 100 may comprise for a (or one) specific stress component the first piezo-resistive coefficient $\pi_{R1}$ for the current flow in the lateral direction and for the specific stress component (i.e. the same specific stress component) the second piezo-resistive coefficient $\pi_{R2}$, different from the first piezo-resistive coefficient $\pi_{R1}$, for the current flow in the vertical direction.

Further, in other words, the second piezo-resistive coefficient in the vertical direction may refer to a homogenous current flow in the vertical direction wherein the stress is arbitrary. Thereby, each of the six stress components comprises one piezo-resistive coefficient (for a current flow in a specific direction). Similarly, the first piezo-resistive coefficient in the lateral direction may refer to homogenous current flow in the lateral direction.

Besides the piezo-resistive effect, there are also other piezo effects such as the piezo-MOS effect, the piezo-junction effect and the piezo-Hall effect. The resistive element 100 could also include these effects. However, the resistive element 100 focuses on the piezo-resistive effect, i.e. although several effects may contribute to the total dependency of the resistive element 100, always a piezo-resistive effect may be present that is used by the resistive element 100.

As already mentioned, a combination of the first component and the second component of the current vector field within the resistive region 102 results in the piezo-resistive coefficient which is defined by the ratio between the first component in the first direction within the resistive region 102 having the first piezo-resistive coefficient $\pi_{R1}$ for the current flow in the first direction and the second component in the second direction within the resistive region 102 having the second piezo-resistive coefficient $\pi_{R2}$ for the current flow in the second direction. Thus, in the region (i.e., resistive region 102) in which the lateral and vertical current flow direction are combined, the same conditions prevail for both components (first component and second component), for example, same stress, same temperature and same doping (and even all further material parameters can be the same). Thus, in contrast to a combination of a pure lateral device and a pure vertical device, matching of (all) relevant parameters of the resistive element 100 and minimal production-related scattering is achieved within the resistive region 102 of the resistive element 100.

Note that within this application, a contact or contact structure (e.g., the first contact structure 106 and/or the second contact structure 108) may be an area that comprises a conductivity that is significantly higher (e.g., by a factor of at least 10 (or 20, 30, 40, 50, 100, 200 or 500) higher) than a conductivity of the resistive region 102 in which the stress effect is converted into the mechanical stress dependent signal. In particular, current streamlines may enter or exit a contact or contact structure at a (substantially) right angle with respect to an interface area between the contact or contact structure and the resistive region 102.

As already mentioned, the first face 112 can be arranged at a first distance to the main surface area 110, wherein the second face 114 can be arranged at a second distance to the main surface area 110. Thereby, the second distance may be greater than the first distance, in other words, the first face 112 and the second face 114 may be spaced apart from each other. Further, as indicated in FIG. 1(a), the first face 112 of the resistive region 102 may be arranged in the plane of the main surface area 110 of the semiconductor substrate 104.

As shown in FIG. 1(a), the resistive region 102 can comprise a third face 116 and a fourth face 118, wherein the third face 116 and the fourth face 118 are spaced apart from each other. Further, the third face 116 and the fourth face 118 can be arranged parallel to the vertical direction.

Thereby, the resistive region 102 can be isolated from the semiconductor substrate 102 in the lateral direction such that the resistive region 102 is isolated from the semiconductor substrate at least along the third face 116 and the fourth face 118.

FIG. 1(b) shows a cross-sectional view of the resistive element 100 for generating a mechanical stress dependent signal having a specific mechanical stress-dependency.

As shown in FIG. 1(b), the first contact structure 106 can be formed such that the specific ratio between the lateral current flow component and the vertical current flow component in the resistive region 102 is obtained.

For example, an area of the first contact structure 106 contacting the first face 112 of the resistive region 102 may be smaller than an area of the second contact structure 114 contacting the second face 114 of the resistive region.

Further, the first contact structure 106 may be adapted to contact the first face 112 of the resistive region 102 in at least two different areas that are spaced apart from each other, i.e. the first contact structure 106 may comprise a first contact and a second contact for contacting the resistive region 102 in the at least two different, spaced apart areas (see for example FIG. 4, reference numerals 106_1 and 106_2).

The first contact structure 106 may comprise, for example, at least two contacts for contacting the resistive region 102 in the at least two different, spaced apart areas.

Further, the first contact structure 106 and the second contact structure 108 can be adapted to contact at least 75% of the sum of the first face 112 and the second face 114 of the resistive region 102.

FIG. 1(c) shows a cross-sectional view of the resistive element 100 for generating a mechanical stress dependent signal having a specific mechanical stress-dependency.

As shown in FIG. 1(c), the resistive region 102 may comprises a confinement structure 124 formed such that the specific ratio between the lateral current flow component and the vertical current flow component in the resistive region 102 is obtained.

For example, the confinement structure 124 can be formed such that the resistive region 102 comprises in a subarea a cross-section reduction in the lateral direction.

Note that the resistive region 102 shown in FIGS. 1(a) to 1(c) can be isolated in the lateral direction from the semiconductor substrate 104 by an isolation structure, wherein the isolation structure can be configured to provide a depletion region adjacent to at least one lateral face, e.g., at least one of the third lateral face 116 or fourth lateral face 118, of the resistive region 102, wherein a width of the depletion region in the lateral direction can be controlled to adjust the ratio between the lateral current flow component and the vertical current flow component in the resistive region 102.

For example, the ratio between the lateral current flow component and the vertical current flow component can be adjusted by changing a width (or thickness) of the depletion region. Thereby, a ratio between the lateral current flow component and the vertical current flow component already may be set due to other conditions, such as the shape of the first contact structure 106 shown in FIG. 1(b) or the confinement structure 124 shown in FIG. 1(c), wherein this ratio may be further adjusted or trimmed by the width of the depletion region.

The width of the depletion region may be adjusted (or varied) by a reverse voltage applied to the depletion region (or depletion layer). This reverse voltage can be provided by applying a suitable potential to the isolation structure or by applying a suitable potential to the resistive element 100. Thereby, the isolation structure may be implemented by means of a p-tub (or p-well) in which the n-type resistive element 100 is embedded.

Naturally, it is also possible that the width of the depletion region in the lateral direction is controlled to obtain the specific ratio between the lateral current flow component and the vertical current flow component in the resistive region 102.

Figure 1D:
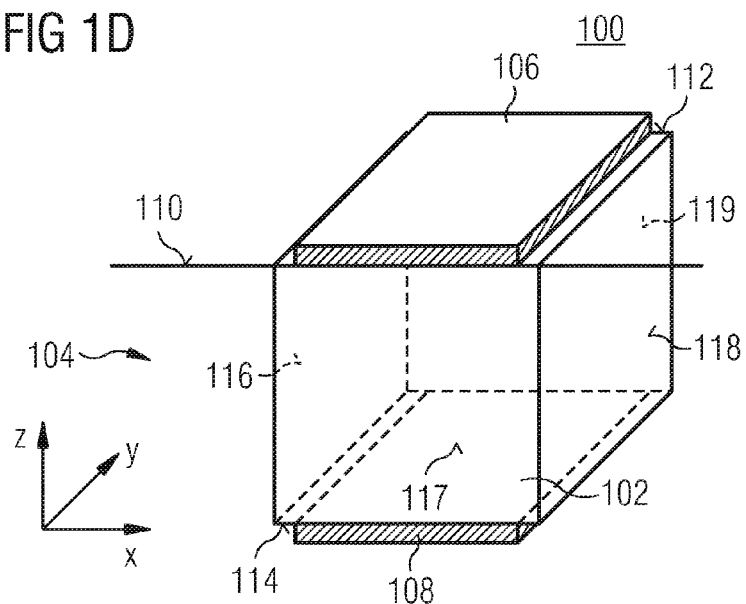
FIG. 1(d) shows a three-dimensional cross-sectional view of the resistive element according to an embodiment.

FIG. 1(d) shows a three-dimensional cross-sectional view of the resistive element 100. As shown in FIG. 1(d), the resistive region 102 may extend in a first lateral direction parallel to the main surface area 110, in a second lateral direction different from the first lateral direction and parallel to the main surface area 110, and in a vertical direction perpendicular to the main surface area 110, may be isolated from the semiconductor substrate 104 in the lateral directions and may comprise for a specific stress component a first piezo-resistive coefficient $\pi_{R1}$ for a current flow in the first lateral direction, a third piezo-resistive coefficient $\pi_{R3}$ for a current flow in the second lateral direction and a second piezo-resistive coefficient $\pi_{R2}$, different from the first piezo-resistive coefficient $\pi_{R1}$ and the third piezo-resistive coefficient $\pi_{R3}$, for a current flow in the vertical direction.

A combination of the first lateral current flow component, the second lateral current flow component and the vertical current flow component results in an output signal having a mechanical stress dependency which is defined by the ratio between the first lateral current flow component having the first piezo-resistive coefficient $\pi_{R1}$ for the current flow in the first lateral direction, the second lateral current flow component having the third piezo-resistive $\pi_{R3}$ coefficient for the current flow in the second lateral direction, and the vertical current flow component having the second piezo-resistive $\pi_{R2}$ coefficient for the current flow in the vertical direction.

Thereby, the resistive element 100 is configured such that a specific ratio between the mean of the first lateral current flow component and the second lateral current flow component, and the vertical current flow component results within the resistive region 102, in order to obtain the mechanical stress dependent signal having the specific mechanical stress-dependency.

Note that the resistive region 102 may extend in two arbitrary lateral directions. Thereby, a combination of the two lateral current flow directions (or components) results in an effective lateral piezo-resistive coefficient for the sum of in-plane normal stress components (parallel to the main surface area 110 of the semiconductor substrate 104). Finally, an (total) effective piezo-resistive coefficient results for the sum of the in-plane normal stress components which comprises a value between the effective lateral piezo-resistive coefficient and the piezo-resistive coefficient for the vertical current flow.

If the first lateral direction and the second lateral direction are perpendicular to each other, and if a dimension of the resistive region 102 in the first lateral direction is equal to a dimension of the resistive region 102 in the second lateral direction (e.g., first and second faces 112 and 114 of the resistive region are squares), then the combination of the first lateral current flow component, the second lateral current flow component and the vertical current flow component results in an output signal having a mechanical stress dependency which is defined by the ratio between a mean of the first lateral current flow component having the first piezo-resistive coefficient $\pi_{R1}$ for the current flow in the first lateral direction and the second lateral current flow component having the third piezo-resistive $\pi_{R3}$ coefficient for the current flow in the second lateral direction, and the vertical current flow component having the second piezo-resistive $\pi_{R2}$ coefficient for the current flow in the vertical direction. In other words, the total piezo-resistive coefficient $\pi_R$ of the resistive element 100 may be in the range between the mean of the first and third piezo-resistive coefficients $\pi_{R1}$ and $\pi_{R3}$ and the second piezo-resistive coefficient $\pi_2$, $$\text{i.e. } \pi_R = \left\{ \frac{(\pi_{R1} + \pi_{R3})}{2} \ldots \pi_{R2} \right\}.$$

As already mentioned, this can be achieved if both lateral current flow directions (first and second lateral current flow directions) are weighted with 0.5 (50%), e.g., if the resistive element 100 comprises a 90°-xy-symmetry.

Naturally, it is also possible to set an arbitrary mix ratio $x \cdot \pi_{R1} + (1-x) \cdot \pi_{R3}$ for $0 \le x \le 1$, by weighting the first and second lateral current flow components respectively, e.g., by means of the shape of the geometry. If the mix ratio x=0.5 then the same piezo-coefficients may result for $\sigma_{XX}$ and $\sigma_{XX}$ which corresponds (or is equal) to the stress dependency of Hall plates.

In FIG. 1(d) and in some of the following Figs. a reference coordinate system having an x-axis, a y-axis and a z-axis perpendicular to each other is shown. Thereby, the first lateral direction can be arranged parallel to or along the x-axis of the reference coordinate system, wherein the second lateral direction can be arranged parallel to or along the y-axis of the reference coordinate system, and wherein the vertical direction can be arranged parallel to or along the z-axis of the reference coordinate system.

Note that the lateral direction mentioned above with respect to FIGS. 1(a) to 1(c) may refer to a plane spanned by the first lateral direction and the second lateral direction. Naturally, the lateral direction may also refer to the first lateral direction, to the second lateral direction or to a combination of the first lateral direction and the second lateral direction.

For example, the above mentioned isolation of the resistive region 102 from the semiconductor substrate 104 in the lateral direction may include an isolation of the resistive region 102 along the third and fourth faces 116 and 118 (as already mentioned above) and also along fifth and sixth faces 117 and 119. Thereby, the third and fourth faces 116 and 118 may be spaced apart from each other and arranged parallel to a plane spanned by the first lateral direction and the vertical direction, wherein the fifth face 117 and the sixth face 119 may be spaced apart from each other and arranged parallel to a plane spanned by the second lateral direction and the vertical direction.

Subsequently, the resistive element 100 shown in FIG. 1(d) shall be described in detail from another technical point of view. Naturally, the following description is also applicable to the resistive element 100 shown in FIGS. 1(a) to 1(c).

As shown in FIG. 1(a), the resistive element 100 comprises a resistive region 102 formed in a semiconductor substrate 104 and contacts 106 and 108. The semiconductor substrate 104 comprises a main surface area 110 and extends in a first lateral direction parallel to the main surface area 110, and in a second lateral direction parallel to the main surface area and different from the first lateral direction, and in a vertical direction perpendicular to both of the first lateral direction and second lateral direction.

The resistive region 102 extends in at least one of the first lateral direction and second lateral direction between lateral boundaries 116 and 118 and/or 117 and 119 (e.g., between third and fourth faces 116 and 118 and/or between fifth and sixth faces 117 and 119), and in an out-of-plane direction between top and bottom boundaries 112 and 114 (e.g., between first and second faces 112 and 114), wherein the out-of-plane direction is different from all possible linear combinations of the first lateral direction and second lateral direction, wherein the resistive region 102 is isolated along its lateral boundaries against the semiconductor substrate 104. The contacts 106 and 108 are arranged at least at portions of the top and bottom boundaries 112 and 114 of the resistive region 102. The resistive region 102 comprises a first piezo-resistive coefficient $\pi_{R1}$ for a current flow along the first lateral direction and a specific stress component and a second piezo-resistive coefficient $\pi_{R2}$ for a current flow along the vertical direction and the specific stress component. At least one of the contacts 106 and 108 is configured to generate in response to an input signal applied to the respective contact a current vector field within the resistive region 102. Thereby, the boundary conditions imposed (by the boundaries of the resistive region 102) on the current vector field inside the resistive region 102 are such that the resistance between two of the contacts 106 and 108 comprises a piezo-resistive coefficient $\pi_R$ value between the values of the first piezo-resistive coefficient $\pi_{R1}$ and the second piezo-resistive coefficient $\pi_{R2}$.

Thereby, the out-of-plane direction can be parallel to the vertical direction.

Further, one of the contacts 106 and 108 may cover the entire top boundary 112 (or top face) of the resistive region 102 or the entire bottom boundary 114 (or bottom face) of the resistive region 102.

For example, the bottom boundary 114 (or bottom face) may be contacted entirely by a buried layer.

As shown in FIG. 1(d), the resistive region 102 may also extend in both of the first lateral direction and the second lateral direction, wherein the resistive region 102 comprises a third piezo-resistive coefficient $\pi_{R3}$ for a current flow along the second lateral direction. Thereby, the boundary conditions imposed on the current vector field inside the resistive region 102 may be such that the resistance between the two of the contacts 106 and 108 comprises a piezo-resistive coefficient $\pi_R$ value between the values of the second piezo-resistive coefficient $\pi_{R2}$ and a mean of the first piezo-resistive coefficient $\pi_{R1}$ and the third piezo-resistive coefficient $\pi_{R3}$.

Referring to FIG. 1(b), the boundary conditions (e.g., imposed by the first contact structure 106) can be set such that only portions of the top boundary 112 of the resistive region 102 are contacted with at least one top contact 106.

Thereby, the mix ratio between lateral and vertical current flow directions (or components) within the resistive element 100 can be set by the geometry of the contacts. For example, the lateral current flow component (or portion, or proportion) can be increased by decreasing an area of at least one of the contacts is decreased. As a result, the piezo-resistive coefficient $\pi_R$ of the resistive element 100 can be reduced from 55%/Gpa to lower values, including negative values.

Further, referring to FIG. 1(c), the boundary conditions (e.g., imposed by the confinement structure 124) can be set such that at least portions of the lateral boundaries of the resistive region 102 force vertical current streamlines to take bends into lateral directions.

For example, sidewalls (or side faces 116, 117, 118 or 119) of the resistive region 102 may comprise a confinement structure 124, such as a ring-shaped bulge or a lobe, that confines a current carrying cross-section of the resistive region 102 in order to bend current streamlines.

In other words, as shown in FIGS. 1(b) and 1(c), boundary conditions (e.g., contacts or lateral boundaries) can be configured such that a specific effective piezo-coefficient $\pi_R$ results. Thereby, a specific mixing ratio of horizontal and vertical current flow components is implemented.

Further, also in the center of the resistive region 102 a non-conductive area (confinement structure 124) may be inserted around which the current streamlines bend, in order to increase the lateral current flow component (or proportion). Such a confinement structure 124 may form a new boundary within the resistive region 102 instead of forming a boundary at a circumference of the resistive element 100.

Figure 1E:
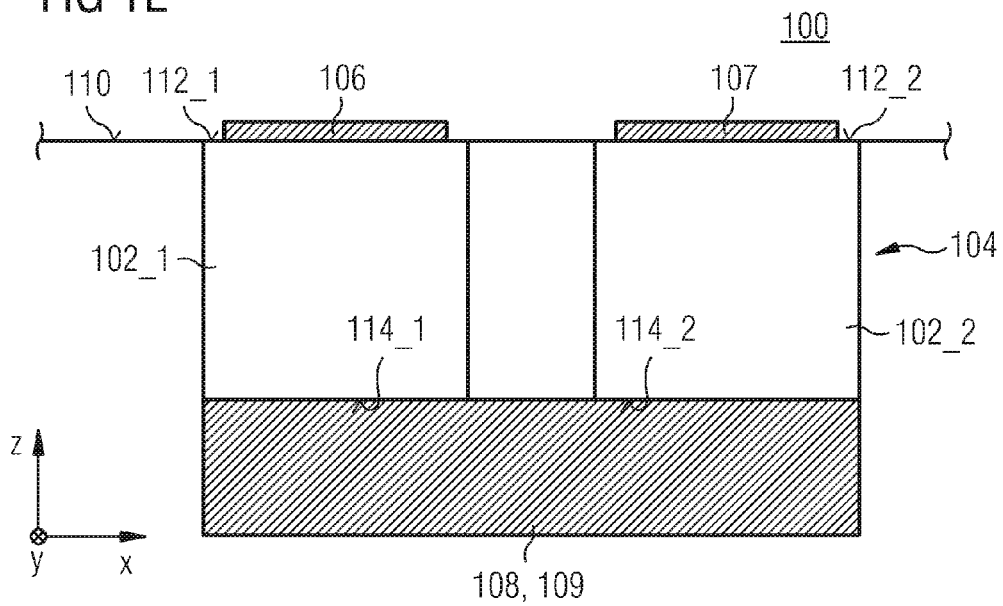
FIG. 1(e) shows a cross-sectional view of the resistive element according to an embodiment.

FIG. 1(e) shows a cross-sectional view of a resistive element 100 comprising a first resistive region 102_1 and a second resistive region 102_2 formed in the same semiconductor substrate 104. Further, the resistive element 100 may comprise a first contact structure 106, a second contact structure 108, a third contact structure 107 and a fourth contact structure 109.

The first resistive region 102_1 and the second resistive region 102_2 may extend in the first lateral direction parallel to the main surface area 110, in the second lateral direction, different from the first lateral direction and parallel to the main surface area 110, and in the vertical direction perpendicular to the main surface area 110, may be isolated from each other and from the semiconductor substrate in the first lateral direction and the second lateral direction, and comprise for a specific stress component a first piezo-resistive coefficient $\pi_{R1}$ for a current flow in the first lateral direction, a third piezo-resistive coefficient $\pi_{R3}$ for a current flow in the second lateral direction, and a second piezo-resistive coefficient $\pi_{R2}$, different from the first piezo-resistive coefficient $\pi_{R1}$ and the third piezo-resistive coefficient $\pi_{R3}$, for a current flow in the vertical direction.

The first contact structure 106 can be arranged to contact at least a portion of a first face 112_1 of the first resistive region 102_1 parallel to the main surface area 110 and positioned at a first distance to the main surface area 110.

The second contact structure 108 can be arranged to contact at least a portion of a second face 114_1 of the first resistive region 102_1 different from the first face 112_1 of the first resistive region 102_1, parallel to the main surface area 110 and arranged at a second distance to the main surface area 110 different from the first distance.

The third contact structure 107 can be arranged to contact at least a portion of a first face 112_2 of the second resistive region 102_2 parallel to the main surface area 110 and positioned at a third distance to the main surface area 110.

The fourth contact structure 109 can be arranged to contact at least a portion of a second face 114_2 of the second resistive region 102_2 different from the first face 112_2 of the second resistive region 102_2, parallel to the main surface area 110 and positioned at a fourth distance to the main surface area 110 different from the third distance.

Thereby, the second contact structure 108 and the fourth contact structure 109 can be connected to each other.

For example, as shown in FIG. 1(e), the second contact structure 108 and the fourth contact structure 109 can be implemented by means of a (common or single) semi conductive region or a floating low impedance region, such as a buried layer (e.g., an nBL, i.e. an n-type buried layer), arranged to contact the (entire) second face 114_1 of the first resistive region 102_1 and the (entire) second face 114_2 of the second resistive region 102_2.

Thereby, the (single) semi conductive region may be buried in the semiconductor substrate 104 such that it comprises neither the first main surface area (e.g., top surface) of the semiconductor substrate 104 nor a second main surface area (e.g., bottom surface) of the semiconductor substrate 104, opposing the first main surface area. In other words, the single) semi conductive region may buried in the semiconductor substrate 104 such that it is spaced apart from the first main surface area and spaced apart from the second main surface area.

Naturally, also the semiconductor substrate 104 may be used for implementing the second contact structure 108 and the fourth contact structure 109. In other words, the second contact structure 108 and the fourth contact structure 109 may be identical to the semiconductor substrate 104. In that case, the semiconductor substrate may form a common network node that is assigned or allocated to a plurality of devices, e.g., of an integrated circuit. For example, the network node may be adapted to provide a common ground potential for the (entire) integrated circuit. Further, the network node may be contactable at a backside of the wafer.

The resistive element 100 can be adapted to generate in response to an input signal applied to at least one of the first contact structure 106 and second contact structure 108 a current flow within the first resistive region 102_2 between the first contact structure 106 and the second contact structure 108 having a first lateral current flow component, a second lateral current flow component and a vertical current flow component, and to generate in response to an input signal applied to at least one of the third contact structure 107 and fourth contact structure 109 a current flow within the second resistive region 102_2 between the third contact structure 107 and the fourth contact structure 109 having a first lateral current flow component, a second lateral current flow component and a vertical current flow component.

For example, the input signal may be a current applied to the first contact structure 106 which leads to a current flow from the first contact structure 106 through the first resistive region 102_1 to the second contact structure 108. Since the second contact structure 108 and the fourth contact structure 109 are connected to each other, the current flows through this connection (e.g., a buried layer) from the second contact structure 108 to the fourth contact structure 109, and from the fourth contact structure 109 through the second resistive region 102_2 to the third contact structure 107.

Thereby, a combination of the first lateral current flow components, the second lateral current flow components and the vertical current flow components results in the output signal having the mechanical stress dependency which is defined by the ratio between a mean of the first lateral current flow component having the first piezo-resistive coefficient $\pi_{R1}$ for the current flow in the first lateral direction and the second lateral current flow component having the third piezo-resistive coefficient $\pi_{R3}$ for the current flow in the second lateral direction, and the vertical current flow component having the second piezo-resistive coefficient $\pi_{R2}$ for the current flow in the vertical direction.

The resistive element 100 can be configured such that the specific ratio between the mean of the first lateral current flow component and the second lateral current flow component, and the vertical current flow component results within the first resistive region 102_1 and the second resistive region 102_2, in order to obtain the mechanical stress dependent signal having the specific mechanical stress-dependency.

For example, the mechanical stress dependent signal (or output signal) having the specific mechanical stress-dependency may be the current provided at the third contact structure 107.

How the resistive element 100 may achieve to obtain the mechanical stress dependent signal having the specific mechanical stress-dependency was already described in detail above with reference to FIGS. 1(a) to 1(d), and does also apply to the resistive element 100 shown in FIG. 1(e).

For example, at least one of the first contact structure 106 and the third contact structure 107 may be formed as shown and described with respect to FIG. 1(b). Further, at least one of the first resistive region 102_1 and the second resistive region 102_2 may comprise a confinement structure 124 as shown and described in FIG. 1(c).

Naturally, it is also possible that (only) the first contact structure 106 is formed as shown and explained with respect to FIG. 1(b), wherein (only) the second resistive region 102_2 comprises a confinement structure 124 as shown and explained with respect to FIG. 1(c).

The resistance R of the resistive element 100 at any stress can be calculated to $$R = R_0(1 + \pi_R \cdot \sigma),$$

wherein $R_0$ is the resistance of the resistive element at no stress, $\sigma$ is the stress and $\pi_R$ is the (total) piezo-resistive coefficient. Thereby, for simplicity's sake, $\sigma_{XX} + \sigma_{YY}$ is designated with $\sigma$. What may be essential here is that $\sigma_{XX}$ is multiplied by the same factor $\pi$ as is $\sigma_{YY}$. This is important because the current-related magnetic sensitivity of the Hall probe (Si) may have a similar stress sensitivity: $1 + P_{n,Hall}(\sigma_{XX} + \sigma_{YY})$.

The specific mechanical stress dependency of the mechanical stress dependent signal generated by the resistive element 100 should be between $+3*10^{\wedge}(-10)/Pa$ and $+6*10^{\wedge}(-10)/Pa$ times the sum of in-plane stress components parallel to the main surface area 110 of the semiconductor substrate 104.

Naturally, the mechanical stress dependent signal generated by the resistive element 100 may also depend from other stress components. Thereby it is only of interest (or importance) that the mechanical stress dependency of the in-plane stress components may be in the range between $+3*10^{\wedge}(-10)/Pa$ and $+6*10^{\wedge}(-10)/Pa$ times the sum of the in-plane stress components parallel to the main surface area 110 of the semiconductor substrate 104, i.e. the mechanical stress dependency may have no additional part having the form $(\sigma_{XX} - \sigma_{YY})$. In order to realize this, the mechanical stress dependency may have the same stress coefficients for $\sigma_{XX}$ and $\sigma_{YY}$.

Thus, the resistive element 100 shown in FIGS. 1(a) to 1(e) provides a mechanical stress dependent signal having a specific stress-dependency. Therefore, the resistive element 100 can be used, for example, to supply a Hall plate or a vertical Hall device, as will become clear from the following description.

Thereby, the resistive element 100 and the Hall effect device, e.g., a Hall plate or a vertical Hall device, may be formed in the same semiconductor substrate 104, such that the resistive element 100 and the Hall effect device may be exposed to substantially the same mechanical stress. Therefore, a distance between the resistive element 100 and the Hall effect device may be chosen such that both, the resistive element 100 and the Hall effect device may be exposed to the same mechanical stress or at least to mechanical stress values correlating well (for example, the mechanical stress values may be different if a fixed ratio, such as 0.5, exists between them). The distance between the resistive element and the Hall effect device 300 may be defined by a chip size, lead frame or package. For example, the distance between the resistive element and the Hall effect device 300 may be 100 μm (or 70, 80, 90, 110, 120 or 130 μm). However, in some cases even a distance of 1 mm may be possible since the mechanical stress $\sigma_{XX} + \sigma_{YY}$ is almost constant at the surface 110 of the semiconductor substrate, with the exception of a ring-shaped area along the edge of the chip that is as wide as the chip thickness (according to the principle of de St. Venant).

Note that the difference between a Hall plate and a vertical Hall effect device is that the Hall plate may be configured to sense magnetic field components perpendicular to the main surface area 110 of the semiconductor substrate 104 (e.g., vertical magnetic field components), wherein the vertical Hall effect device may be configured to sense magnetic field components parallel to the main surface area 110 of the semiconductor substrate 104 (e.g., lateral or in-plane magnetic field components).

Figure 2:
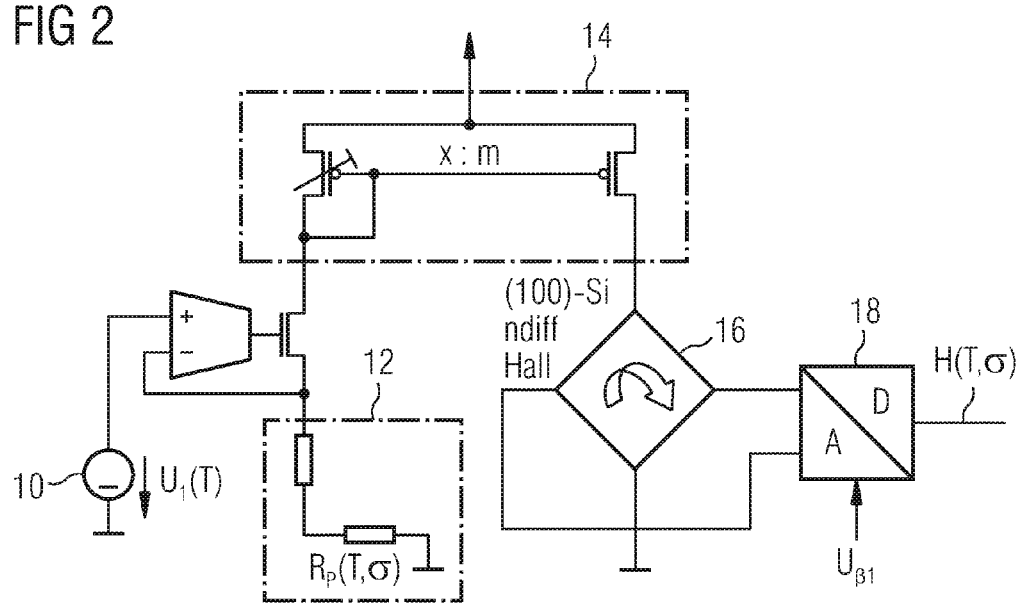
FIG. 2 shows a block diagram of a prior art Hall sensor.

FIG. 2 shows a block diagram of a prior-art Hall sensor. Thereby, an input voltage $U_1(T)$ of suitable temperature coefficient provided by a voltage source 10 is copied onto a p-diffusion resistor-L 12 $R_P(T, \sigma)$ giving rise to a bias current which depends only weakly on the sum of the in-plane normal stress components. An adjustable current mirror (x:m) 14 compensates for production spread of sheet resistances. It supplies an n-type spinning current Hall plate 16 of which the magnetic sensitivity is notably affected by mechanical stress via piezo-Hall effect. Thus, the A/D-converted Hall signal converted by an A/D-converter 18 suffers from a stress influence of roughly 42%/GPa.

As shown in FIG. 2, all circuitry left of the Hall plate 16 belongs to the current generator. Thereby, the voltage $U_1(T)$ can be copied onto the resistor 12 $R_P(T, \sigma)$, which makes a current flow through the resistor 12 $R_P(T, \sigma)$. This current can be sent through the PMOS-current mirror 14 with a mirror ratio x:m before it is injected into the Hall plate 16. The Hall plate 16 may be a spinning current type Hall plate.

If a resistor Rp with the following stress dependency $$R_P = R_{P0}(T) \cdot (1 + \pi \cdot \sigma)$$

is provided, then the output signal of the Hall plate would have the total magnetic sensitivity $$S(T) = \frac{S_{i,0}(T)}{R_{P,0}(T)} U_1(T) \frac{1 + P_{n,Hall}\sigma}{1 + \pi\sigma}.$$

Of course, if $P_{n,Hall} = \pi$ the total magnetic sensitivity becomes independent of mechanical stress.

The problem is that up to now there is no resistor with this required stress dependency available. A piezo-resistive coefficient $\pi_R$ of about +42%/GPa would be needed, yet n-type diffusions (or implantations) have only −24.4%/GPa (or smaller magnitudes), and p-type diffusions have only +2.8%/GPa (or smaller magnitudes), and poly-silicon resistors have the same sign as their diffused counterparts with smaller magnitudes.

Theoretically, a diffused n-type resistor with homogeneous current flow in a direction vertically through the silicon die—i.e. in [001]-direction—has a piezo-resistive coefficient $\pi_R$ of +53.4%/GPa, which is 27% larger than required. One problem is to realize such a current flow direction and to reduce the piezo-resistive coefficient $\pi_R$ by 27% in order to match the one of the Hall plate.

Figure 3A:
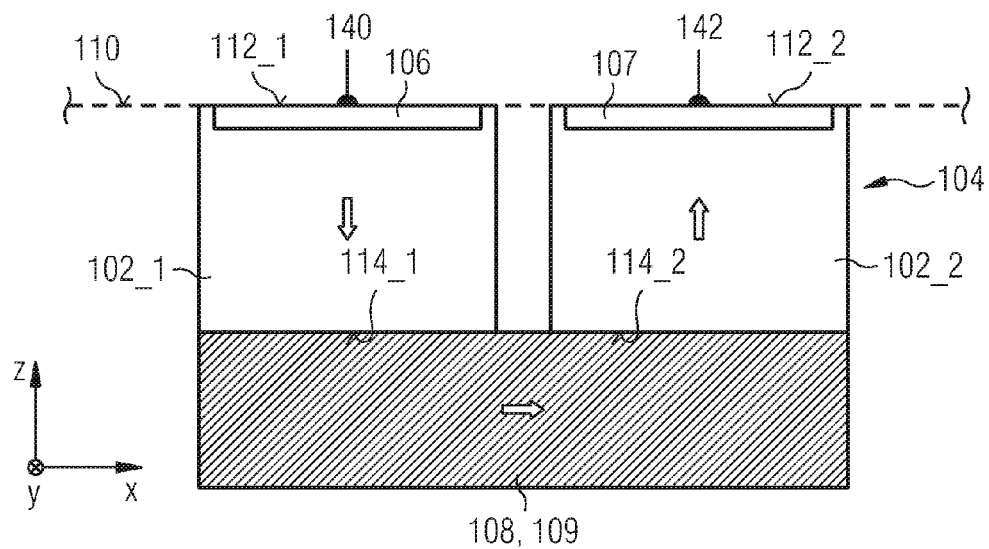
FIG. 3(a) shows a cross-sectional view of the resistive element.
Figure 3B:
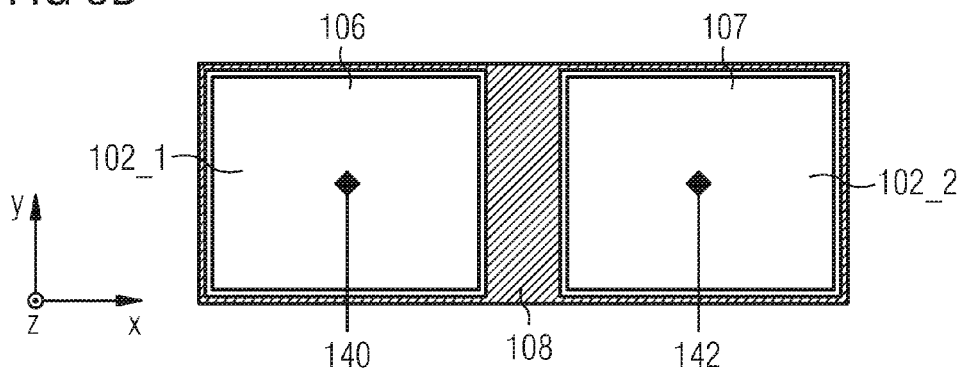
FIG. 3(b) shows a top view of the resistive element shown in FIG. 3(a)

The first problem can be solved, for example, by a BiCMOS-technology (BiCMOS is a semiconductor technology that integrates the bipolar (Bi) transistor and complementary metal-oxide-semiconductor (CMOS) transistor technology) with a buried layer. The cross section is shown in FIG. 3(a), wherein the layout is shown in FIG. 3(b). Thereby, the current flow direction is indicated by arrows in FIG. 3(a).

As shown in FIGS. 3(a) and 3(b), the resistive element comprises a first resistive region 102_1, a second resistive region 102_2, a first contact structure 106, a second contact structure 108, a third contact structure 107 and a fourth contact structure 109. The second contact structure 108 and the fourth contact structure 109 are implemented by means of a common buried layer 108, 109 contacting the (entire) second face 114_1 of the first resistive region 102_1 and the (entire) second face 114_2 of the second resistive region 102_2. Further, the resistive element may comprise a first terminal 140 connected to the first contact structure 106 and a second terminal 142 connected to the second terminal 142.

Each of the first contact structure 106 and third contact structure 107 may comprise a contact, e.g., a contact diffusion (e.g., n+ doped with >10^19/cm$^3$, e.g., 0.1 ... 0.3 μm deep). The first and second resistive regions 102_1 and 102_2 are the active regions of the resistive element and may have the lowest conductivity of all current carrying regions in the resistive element (e.g., low n-type doping, e.g., n-epitaxial layer with about 10^15 ... 10^17/cm$^3$, e.g., 5 μm deep). The buried layer 108, 109 may have a conductivity much higher than the resistive regions 102_1 and 102_2 (at least 10 times), e.g., n-type.

FIGS. 3(a) and 3(b) do not show how the device (or resistive element 100) is isolated laterally since all kinds of isolations (or isolation structures) are possible, such as trench isolations or deep p-isolation tubs. The only important aspect is that the isolation between both regions 102_1 and 102_2 (or between the first resistive region and the second resistive region) does not split apart the common buried layer 108, 109, whereas the isolation at the very left and right of the device 100 also may cut through the buried layer 108, to liberate it from all other devices on the substrate 104.

Note that with some technologies it is not possible to realize a lateral isolation between the first resistive region 102_1 and the second resistive region 102_2 without spitting apart the buried layer 108, 109. It may be sufficient (in approximation) that a lateral distance between the first resistive region 102_1 and the second resistive region 102_2 is equal to or greater than a dimension of the first and second resistive regions 102_1 and 102_2 in the vertical direction. In that case, a predominant or mayor part of the current will flow through the buried layer 108, 109 and only a negligible part will flow through the insufficient isolation between the first and second resistive regions 102_1 and 102_2.

If the conductivity of the first and third contact structures (or regions) 106 and 107 is much higher (e.g., at least 10 times higher) than the conductivity of the first and second resistive regions 102_1 and 102_2, then the current streamlines are forced to be perpendicular at the interfaces between the first contact structure 106 and the first resistive region 102_1, between the third contact structure 107 and the second resistive region 102_2, between the first resistive region 102_1 and the buried layer 108, 109, and between the second resistive region 102_2 and the buried layer 108, 109.

If the first and third contact structures 106 and 107 and the buried layer 108, 109 overlap the first and second resistive regions 102_1 and 102_2 entirely (e.g., as shown in FIGS. 3(a) and 3(b)) or up to a very high degree, then the current streamlines go (exactly) vertical (or in other words, at a right angle up or down through the first and second resistive regions 102_1 and 102_2 without having any notable curvature. This means that the current is predominantly vertical and only a negligible portion flows laterally. The lateral current through the buried layer 108, 109 is irrelevant, because the buried layer 108, 109 portion accounts only for a few percent of the overall resistance (of the resistive element) and it has only a very small stress dependency due to its high doping level. Thus, the resistive element shown in FIGS. 3(a) and 3(b) has a piezo-resistive coefficient $\pi_R$ of about 53%/G Pa.

Therefore, the piezo-resistive coefficient $\pi_R$ should be trimmed to +42%/GPa. There are essentially two possibilities for achieving this: increasing the doping level of the first and second resistive regions 102_1 and 102_2 or reducing the size of the regions (or areas) in which the first and third contact structures 106 and 107 are contacting the first and second resistive regions 102_1 and 102_2.

So far "low doping" was assumed for the first and second resistive regions 102_1 and 102_2, which means less than roughly 10^18/cm$^3$. If the doping is increased beyond this level the piezo-resistive coefficients get smaller. It is known that the piezo-resistive coefficient becomes 22.4%/GPa at a doping concentration of 10^20/cm$^3$. Thus, slightly above 10^18/cm$^3$ the piezo-resistive coefficient should become 42%/GPa. However, this is still difficult to achieve in practice, because there is no such doping profile available in modern CMOS technologies.

Moreover this doping level differs from typical doping levels for Hall effect devices, which are below 10^17/cm$^3$; and having two different doping levels means that there is a process spread between them which leads to poor accuracy of the stress compensation.

A cheaper way to reach the target of +42%/GPa is to mix vertical and lateral current flow directions. If more lateral current flow portions are added, they add their negative piezo-coefficient thereby reducing the total piezo-resistive coefficient $\pi_R$.

This is readily obtained by making the contacts (or contact areas of the first and third contact structures 106 and 107) smaller than the lateral dimensions of the first and second resistive regions 102_1 and 102_2. Then the current spreads out when leaving or entering the contacts (of the first and third contact structures 106 and 107) and this leads to portions with lateral current flow direction.

There are numerous ways to make the contacts (or contact areas in which the first and third contact structures 106 and 107 contact the first and second resistive regions 102_1 and 102_2) smaller.

For example, the first contact structure 106 may be adapted to contact the first face 112_1 of the first resistive region 102_1 in (at least) two different areas that are spaced apart from each other, e.g., by means of (at least) two contacts that are spaced apart from each other. Similarly, the third contact structure 107 may be adapted to contact the first face 112_2 of the second resistive region 102_2 in (at least) two different areas that are spaced apart from each other, for example, by means of (at least) two contacts that are spaced apart from each other.

Further, the first contact structure 106 and the second contact structure 108 can be adapted to contact at least 75% (i.e. 75% to 100%) of the sum of the first face 112 and the second face 114 of the resistive region 102. As already mentioned, a perfect vertical current flow (within the resistive region 102) achieves a piezo-resistive coefficient of +52/GPa which can be reduced to +42%/GPa by adding a slightly lateral current flow component. A perfect vertical current flow means that both contacts (first contact structure 106 and second contact structure 108) are congruent, comprise identical lateral positions and cover 100% of the sum of the first face 112 and the second face 114 of the resistive region 102. Since in the semiconductor process no leaning or inclined walls may be produced, the piezo-resistive coefficient may be reduced from +52/GPa to +42/GPa by reducing the size of the contacts, i.e., making the contacts (first and second contact structures) smaller than the first and second faces. Since the second contact structure 108, when implemented as buried layer, always contacts the entire second face of the resistive region 102, only the first contact structure 106 may be produced or implemented such that an area of the first contact structure 106 is smaller than the first face of the resistive region 102. Thereby, it does not matter if the first contact structure 106 is adapted to contact the first face of the resistive region 102 in only one area or in (at least) two different, spaced apart areas.

In the following it is assumed, that each of the first and third contact structures 106 and 107 comprises a center contact and a circumferential ring contact surrounding the center contact. In other words, contacts (of the first and third contact structures 106 and 107) can be split up, for example, in a small center contact and a circumference ring contact, which may be shorted by interconnect lines. Thus, what is at hand is one single contact whose geometry deliberately is not implemented as a large surface so as to give cause for bulges in the streamlines and thus to combine vertical and horizontal current flow components or directions in a specific mixing ratio so as to thereby adjust the desired piezo-resistive coefficient.

Naturally, also other shapes of the contacts of the first and third contact structures 106 and 107 are possible. For example, the circumference ring contact may be split in two parts, wherein the center contact may comprise a longitudinal shape.

FIG. 4 shows a three-dimensional cross-sectional view of half of the resistive element 100. As indicated in FIG. 4, the first contact structure 106 can comprise a circumference ring contact 106_1 surrounding a center contact 106_2, in order to contact the first face 112_1 of the first resistive region 102_1 in two different areas that are spaced apart from each other.

As already mentioned, in FIG. 4 only half of the resistive element 100 is shown, i.e. the resistive element 100 may further comprise a second resistive region 102_2 and a third contact structure 107 which also may comprise a circumference ring contact 106_1 surrounding a center contact 106_2.

In other words, FIG. 4 shows half of the resistive element (or device) 100: it may be composed of (a first contact structure 106 having) two contacts 106_1 and 106_2—a small center contact 106_2 and a ring contact 106_1, a first resistive region 102_1 (e.g., nEpi) and a buried layer 108, 109 (e.g., nBL).

Note that (at least) one of the contacts of the first and third contact structures 106 and 107 may be a floating contact. For example, the circumference ring contact 106_1 shown in FIG. 4 may be a floating contact, i.e. this contact is not connected to another contact of the contact structure. Thus, (only) the center contact 106_2 of the contact structure may be used for contacting the resistive element 100, wherein the circumference ring contact 106_1 may pull or draw out a portion of the current streamlines in the lateral direction, before these current streamlines flow into the depth of the resistive element 100 towards the buried layer 108, 109. Thus, the circumference ring contact 106_1 may increase the lateral current flow portion without being used for contacting the resistive element 100.

Further, different potentials can be applied to the center contact 106_2 and the circumference ring contact 106_1 in order to modulate the resistor along the one current flow path between the first contact structure 106 and the second contact structure 108.

Figure 5A:
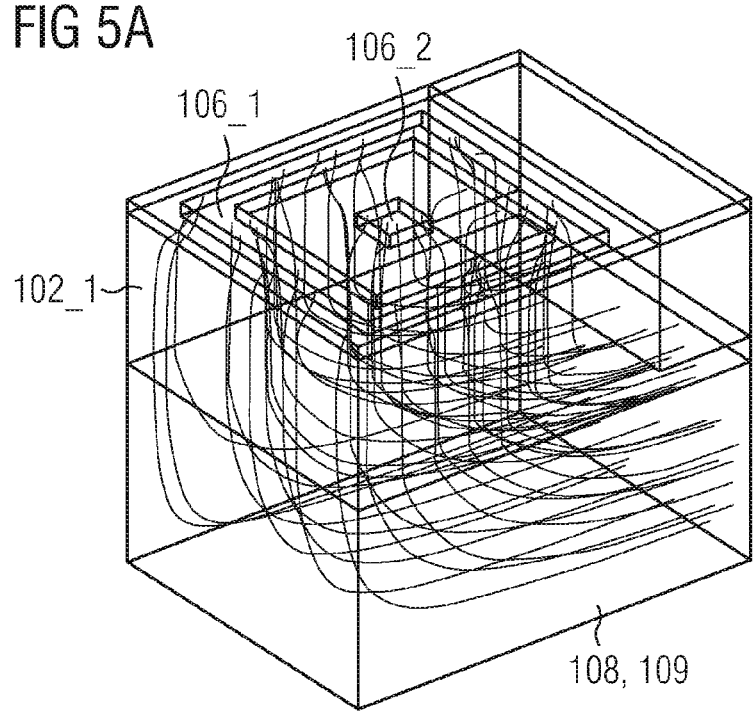
FIG. 5(a) shows a three-dimensional cross-sectional view of the resistive element shown in FIG. 4 and current streamlines within the restive region in response to a signal applied to at least one of the first contact structure and second contact structure.
Figure 5B:
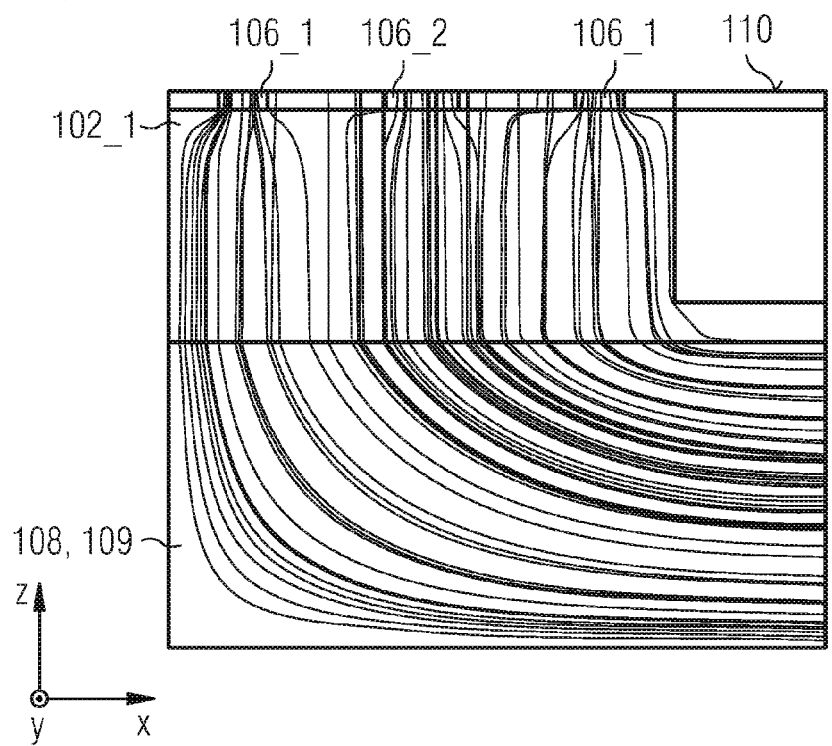
FIG. 5(b) shows a cross-sectional view of the resistive element shown in FIG. 4 and current streamlines within the restive region in response to a signal applied to at least one of the first contact structure and second contact structure.

Current streamlines and a potential distribution of (half of) the resistive element 100 shown in FIG. 4 are shown in FIGS. 5(a), 5(b) and 5(c).

As shown in FIGS. 5(a) to 5(c), only close to the top of the resistive element 100 there is some curvature of the current streamlines, whereas in the deeper regions of the resistive element 100 the current flows at straight vertical lines until it reaches the buried layer 108, 109.

The resistance of the resistive element 100 shown in FIG. 4 can be defined by the following equation:

$$R = R_0(1 + 0.479 \cdot \sigma_{XX} + 0.479 \cdot \sigma_{YY} - 0.763 \cdot \sigma_{ZZ} + 0.0023 \cdot \sigma_{XY} - 0.0003 \cdot \sigma_{YZ} + 0.0014 \cdot \sigma_{XZ})$$

Thereby, in the above equation, stress component values should be inserted in Giga Pascal.

Thus, the resistive element 100 shown in FIG. 4 has a piezo-resistive coefficient $\pi_R = 47.9\%/GPa$. This is still too large, because the aim is a piezo-resistive coefficient $\pi_R = +42\%/GPa$, but it is already significantly below 53%/GPa, and it is obvious that by adjusting the dimensions of the ring 106_1 and/or the center contact 106_2 the piezo-resistive coefficient $\pi_R$ can be further reduced to 42%/GPa. This is best done by a DOE (DOE=design of experiment) because numerical simulation is inaccurate due to inaccurate input data (e.g. doping profile versus depth).

An alternative solution is to use a pure vertical resistor like shown above and add a pure lateral one. If the right mixture is chosen, it is possible to obtain any desired piezo-resistive coefficient $\pi_R$ between both extremes (i.e. between −24.4%/GPa and +53%/G Pa). If X is the fraction of lateral resistance ($X = R_{L,0}/R_{total,0}$) then (1−X) is the fraction of the vertical resistance $1 - X = R_{V,0}/R_{total,0}$ and for $R_{total,0} = R_{L,0} + R_{V,0}$ it yields:

$$R_{total} = R_{L,0}(1 + \pi_L \sigma) R_{V,0}(1 + \pi_V \sigma) \Rightarrow R_{total} = R_{total,0}[1 + (X\pi_L + (1-X)\pi_V)\sigma]$$

Thus, the effective piezo-coefficient is $X\pi_L + (1-X)\pi_V$. X is needed in order to obtain 42 = −24.4X + 53(1−X) which is achieved for X = 14.66%. Thus the lateral resistance should be 15% and the vertical resistance should be 85% of the total resistance.

This was detailed for a series connection of two resistors, yet a parallel connection is also possible. With such a parallel connection piezo-coefficients between the two values for pure vertical and lateral resistors also can be achieved.

Finally, in a possible sensor system a first current generator with a vertical resistor and a second one with a lateral resistor can be used. Then both currents can be added to have a supply current for the sensor, such as a Hall plate or a vertical Hall device.

Known systems subtract two currents of two resistors with different piezo-coefficients. With these systems it is possible to generate total piezo-coefficients that are outside the interval between the two piezo-coefficients of both resistors used.

In contrast to that, with the resistive element 100 described herein (only) total piezo-coefficients $\pi_R$ may be generated that are inside the interval between the two piezo-coefficients of both resistors used, yet this may be done much more easily.

Finally, there is one more embodiment, that trims the vertical versus lateral current flow ratios: A pure vertical device is used as shown in FIGS. 7(a) and 7(b)—so this means that contacts, e.g., contact diffusions, (of the first and third contact structures 106 and 107) are as wide as the first and second resistive regions 102_1 and 102_2 to invoke homogeneous vertical current flow. Thereby, first and third contact structures 106 and 107, first and second resistive regions 102_1 and 102_2, and the buried layer 108, 109 can be n-doped. Further, an isolation structure 150, e.g., a p-diffusion, can be added to separate the two resistive regions 102_1 and 102_2, i.e. the first resistive region 102_1 and the second resistive region 102_2. Furthermore, a confinement structure 124, e.g., a deep p-diffusion, can be added which is wider in order to make an obstacle for the current. The p-diffusions are contacted and biased so that the pn-junctions are reverse biased (e.g. the p-diffusion is tied to the most negative potential in the device (or resistive element 100)). A part of the current has to flow around the confinement structure 124, e.g., obstacle, and this invokes curved current streamlines, which adds some lateral current flow portions. This is one way to add small lateral current flow portions to the dominant vertical ones.

Even if the isolation arrangement of the first and second resistive regions 102_1 and 102_2 is not implemented via a reverse biased pn junction but by means of other techniques, a change in the current flow directions results in the first and second resistive regions 102_1 and 102_2 and, thus, an altered piezo-resistive coefficient will result. For example, the isolation arrangement may be effected by means of a trench. This is a conductive, p-doped well extending from the main surface area 110 to the p substrate. For this purpose, the first and second resistive regions 102_1 and 102_2 and the buried layer 108, 109 are fully etched through. What is new about the trench is that a thin oxide can be located between the plug and the first and second resistive regions 102_1 and 102_2 and the buried layer 108, 109, said oxide being electrically insulated. However, since the oxide is so thin, the conductivity in the first and second resistive regions 102_1 and 102_2 will be electrostatically influenced, depending on the degree of the potential difference between the first and second resistive regions 102_1 and 102_2 and the p substrate (=0V). However, this only means that the resistance of the resistive element 100 differs, e.g., when 5V are applied to the terminal of the first contact structure 106 and 4V are applied to the terminal 142 of the third contact structure 107, from the resistance that results when there is only one 1V applied to the terminal 140 of the first contact structure 140 and 0V is applied to the terminal 142 of the third contact structure 107. Both times, exactly 1V drops between the terminal 140 of the first contact structure 106 and the terminal 142 of the second contact structure 107, but the resistance is different. The current flow lines, too, have slightly different paths, as a result of which the piezo-coefficient also changes. Thus, by means of the potential, the piezo-coefficient may also be adjusted—not only for pn insulation, but also for trench insulation or other oxide insulations. For example, an experiment has shown that a piezo-resistive coefficient will almost double when a contact of the resistor device is at substrate potential and the other contact is increased from 0.1V to 1.8V.

Note that the confinement structure 124 (obstacle) can also have a ring shape in the first resistive region 102_1 and also in the second resistive region 102_2, so that all current has to pass through its hole in the center.

Note also that the potential applied to the confinement structure 124 and the isolation structure 150 can be altered in order to increase the reverse bias of the pn-isolation. This leads to a wider depletion width along the pn-junction. With adjustable reverse bias the size of the confinement structure 124 (obstacle) can be adjusted and thus the percentage of lateral current flow added to the vertical one can be trimmed.

Figure 7:
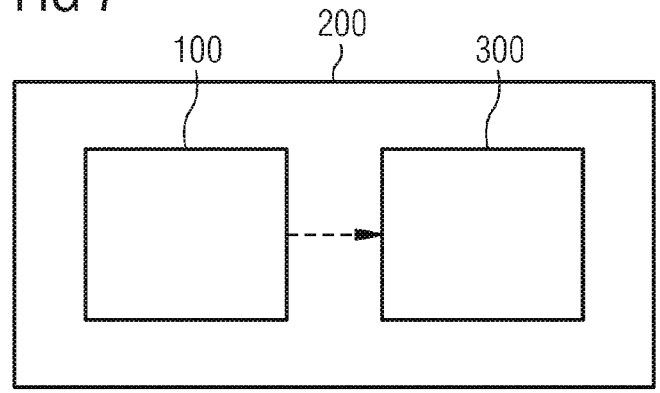
FIG. 7 shows a block diagram of a sensor system.

FIG. 7 shows a block diagram of a system 200 for providing a mechanical stress compensated sensor signal. The system 200 comprises a Hall effect device 300 and the above described resistive element 100. Thereby, the system 200 can be configured to generate a mechanical stress dependent signal by using the resistive element 100, wherein the mechanical stress dependent signal comprises a specific mechanical stress dependency which is defined by the specific piezo-resistive coefficient of the resistive element 100, and to provide the mechanical stress compensated sensor signal by using the Hall effect device and the mechanical stress dependent signal.

For example, by means of the resistive element 100 a current can be defined which is fed into a Hall effect device 300 (e.g., Hall plate or vertical Hall device). Of course it is also possible to provide the Hall effect device 300 with a voltage and to short-circuit an output against a potential or to short-circuit two outputs with each other so as to thereby couple out current. Said short-circuit current may subsequently be amplified—in a state in which it is mixed with other currents—or be sent directly to the resistive element 100, where it causes a voltage drop which may be processed further. In other words, classically the Hall effect device 300 is operated such that current is fed in and voltage is coupled out—however, the reverse case is also possible, where voltage is fed in and current is coupled out. In the first case, the supply current is defined by the resistive element 100; in the second case, the output current is converted to a voltage by the resistive element 100. In both cases, the stress dependency of the output signal may thus be reduced or practically eliminated.

There is yet another alternative. A Hall effect device 300 may be operated in accordance with one of both above-mentioned schemes without using the resistive element 100. If the output signal of the Hall effect device 300 is a voltage, the system will be able to compare said voltage with a further voltage which is generated by directing current onto the resistive element 100. Alternatively, in the event that the output signal of the Hall effect device 300 is a current, said current may be compared with a current defined by means of the resistive element 100. Subsequently, an output signal may be derived from both comparisons, e.g., in the simplest case of a Hall switch, a logic level is created which indicates whether a magnetic field has exceeded/fallen below a switching threshold. In more complicated cases, the result of the comparison may be fed into a feedback loop which changes, e.g., the supply current or the supply voltage of the Hall probe 300 such that both input values of the comparator (which performs the comparison) become as identical as possible.

Further it is possible to amplify, for example, an output signal of the Hall effect device 300. In this context, the amplification factor is defined, for example, by a resistance ratio (as it is common with non-inverting operational amplifiers), wherein one of said resistors defining the resistance ratio may be the above described resistive element 100.

Moreover, the desired effect of a stress independent magnetic sensitivity of a n-doped Hall plate 300 may be achieved by supplying the Hall plate 300 with a current which is generated by a resistive element 100 having a mechanical stress dependency defined by $$R=R_0(1+\pi_R(\sigma_{XX}+\sigma_{YY})),$$

wherein $\pi_R$ comprise a value in the range between 40 to 46%/GPa, wherein this value is in the range between the values of $\pi_{R1}$ and $\pi_{R2}$, wherein $\pi_{R2}$=53%/GPa is the piezo-resistive coefficient of an n-doped resistor in (100)-silicon with pure vertical current flow direction and a 90° symmetry in the xy-plane (parallel to the main surface area 110 of the semiconductor substrate 104 and equal to the (100)-plane), and wherein $\pi_{R1}$=−24.4%/GPa
is the piezo-resistive coefficient of an n-doped resistor in (100)-silicon with pure lateral (i.e., xy) current flow direction and a 90° symmetry in the xy-plane. These resistors and the Hall device may comprise monocrystalline (100)-silicon (i.e., no poly-silicon resistors) and are lightly n doped (e.g., donor concentration smaller than $10^{17}/cm^3$). The piezo-Hall coefficient comprises a value of about 40%/GPa which is closer to the value of the second piezo-resistive coefficient $\pi_{R2}$ than to the value of the first piezo-resistive coefficient $\pi_{R1}$, which is the reason why the vertical current flow component has to dominate within the combined device. A 90° symmetry in the xy-plane may be achieved by an L-shaped layout (i.e., two devices are rotated by 90° against each other and operated such that the same current flows through both them, or such that the same voltage drops over both of them. The 90° symmetry of the resistors may be required to force the same piezo-resistive coefficient for $\sigma_{XX}$ and $\sigma_{YY}$, which is required since the Hall device 300 comprises for an arbitrary geometric shape (including a non 90° symmetry) the same piezo-resistive coefficient for $\sigma_{XX}$ and $\sigma_{YY}$. This is valid for Hall plates, i.e., Hall devices that are sensitive to vertical magnetic field components (e.g., in z-direction). Moreover, the above described procedure may also be applied to vertical Hall devices. Vertical Hall devices comprise a current flow in a vertical direction and in a first lateral direction, but not in a second lateral direction perpendicular to the first lateral direction, and detect magnetic field components parallel to the second lateral direction. Thereby, the piezo-resistive coefficients of vertical Hall devices comprise a value which is closer to zero (the exact value depends on its shape, for example, this value may be in the range between −10%/GPa and +10%/GPa) and comprises different values for $\sigma_{XX}$ and $\sigma_{YY}$. Therefore, the resistive element 100 does not have to comprise a 90°xy-symmetry and may require a greater lateral current flow component than the resistive element for the Hall plate.

Thus, the above described resistive element 100 can be used for stress-compensation of a Hall plate, wherein the resistive element 100 comprises an n-doped resistor whose piezo-resistive coefficient is identical with the piezo Hall coefficient of the Hall plate.

However, as already indicated, the resistive element 100 also can be used for vertical Hall probes—even though in that case, a different piezo-coefficient is required, said piezo-coefficient can basically also be adjusted by using the above described method, e.g., specific shaping of contact geometry or specific shaping of the resistive region.

Figure 8:
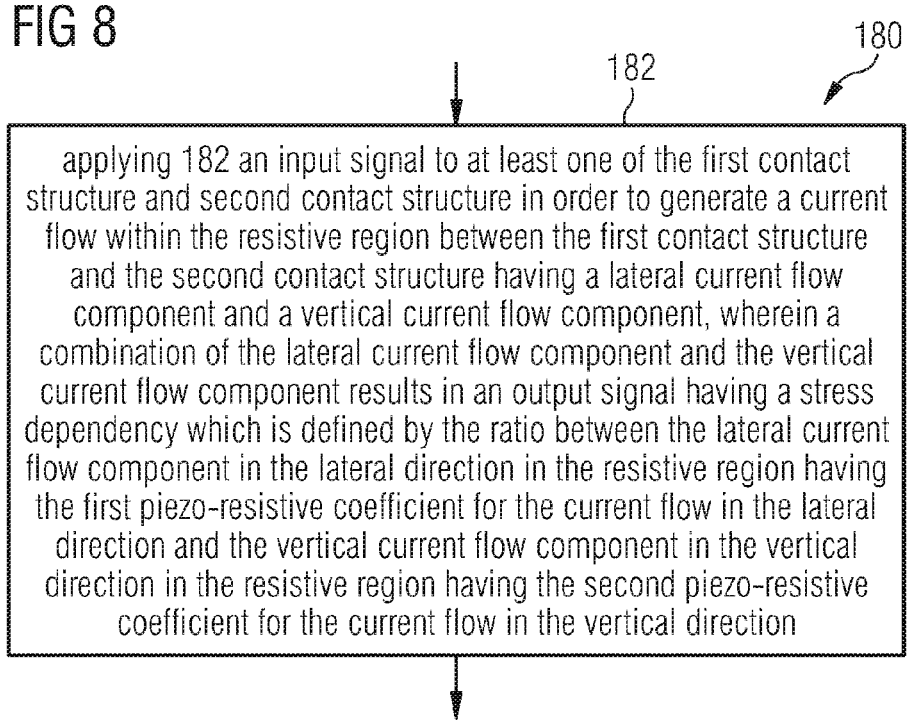
FIG. 8 shows a flowchart of a method for generating a mechanical stress dependent signal having a specific mechanical stress-dependency.

FIG. 8 shows a flowchart of a method 180 for generating a mechanical stress dependent signal having a specific mechanical stress-dependency with a resistive element is provided. The resistive element comprises a resistive region formed in a semiconductor substrate, a first contact structure and a second contact structure, wherein the semiconductor substrate comprises a first main surface area, wherein the resistive region extends in a lateral direction parallel to the main surface area and in a vertical direction perpendicular to the main surface area, is isolated from the semiconductor substrate in the lateral direction and comprises for a specific stress component a first piezo-resistive coefficient for a current flow in the lateral direction and a second piezo-resistive coefficient, different from the first piezo-resistive coefficient, for a current flow in the vertical direction, wherein the first contact structure is arranged to contact at least a portion of a first face of the resistive region parallel to the main surface area, wherein the second contact structure is arranged to contact at least a portion of a second face of the resistive region different from the first face and parallel to the main surface area. The method 180 comprises applying 182 an input signal to at least one of the first contact structure and second contact structure in order to generate a current flow within the resistive region between the first contact structure and the second contact structure having a lateral current flow component and a vertical current flow component, wherein a combination of the lateral current flow component and the vertical current flow component results in an output signal having a stress dependency which is defined by the ratio between the lateral current flow component in the lateral direction in the resistive region having the first piezo-resistive coefficient for the current flow in the lateral direction and the vertical current flow component in the vertical direction in the resistive region having the second piezo-resistive coefficient for the current flow in the vertical direction. Thereby, the resistive element is configured such that a specific ratio between the lateral current flow component and the vertical current flow component results within the resistive region, in order to obtain the stress dependent signal having the specific stress-dependency.

Some embodiments relate to a signal with a specific piezo-coefficient between a first and a second value by combining a first and a second signal, the first signal derived from a first resistance with a first value of piezo-coefficient, and a second signal derived from a second resistance with a second value of piezo-coefficient, whereby the first resistance has a first current flow direction and the second resistance has a second current flow direction that is perpendicular to the first current flow direction and either first or second direction are perpendicular to the main surface of the substrate.

Thereby, the first and the second resistance can be effective in separate regions on the substrate.

Further, the first and the second resistance can be effective at least partly in identical regions on the substrate.

Further, the first and the second resistance can be effective in regions of the same doping type and optionally the same doping concentration.

Further, the combination can be determined by a contact size relative to the size of the active region in plan view.

Further, the combination can be determined by a an obstacle to the current flow which is composed of a region of opposite type of doping than the active region.

Further, the first current flow direction is perpendicular to the main surface of the substrate.

Further, the first resistance can be effective in at least two regions that are laterally isolated from each other and connected by a buried layer.

Some embodiments provide a sensor system with a sensor element having a sensitivity to a physical quantity that is proportional to a current through the sensor element, and with a generator that supplies said sensor element with electrical energy, whereby the generator combines a first and a second resistance, whereby the current flows through the first resistance in a first direction and through the second resistance in a second direction that is perpendicular to the first direction and either first or second direction are perpendicular to the main surface of the substrate.

Note that instead of a current supplied by the generator, also a voltage supplied by the generator can be used.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A resistive element having a specific piezo-resistive coefficient, wherein the resistive element comprises:
a resistive region formed in a semiconductor substrate, wherein the semiconductor substrate comprises a first main surface area, wherein the resistive region extends in a first lateral direction parallel to the main surface area, in a second lateral direction different from the first lateral direction and parallel to the main surface area, and in a vertical direction perpendicular to the main surface area, wherein the resistive region is isolated from the semiconductor substrate in the lateral directions and comprises for a stress component a first piezo-resistive coefficient for a current flow in the first lateral direction, a third piezo-resistive coefficient for a current flow in the second lateral direction and a second piezo-resistive coefficient, different from the first piezo-resistive coefficient and the third piezo-resistive coefficient, for a current flow in the vertical direction;
a first contact structure arranged to contact at least a portion of a first face of the resistive region parallel to the main surface area and positioned at a first distance to the main surface area;
a second contact structure arranged to contact at least a portion of a second face of the resistive region different from the first face, parallel to the main surface area and positioned at a second distance to the main surface area different from the first distance;
wherein the resistive element is configured to generate, in response to an input signal applied to at least one of the first contact structure and the second contact structure, a current flow distribution within the resistive region between the first contact structure and the second contact structure, the current flow distribution having a first lateral component, a second lateral component and a vertical component;
wherein a combination of the first lateral component, the second lateral component and the vertical component results in a piezo-resistive coefficient of the resistive element which is defined by the ratio between the first lateral component in the first lateral direction in the resistive region having the first piezo-resistive coefficient for the current flow in the first lateral direction, the second lateral component in the second lateral direction in the resistive region having the third piezo-resistive coefficient for the current flow in the second lateral direction, and the vertical component in the vertical direction in the resistive region having the second piezo-resistive coefficient for the current flow in the vertical direction; and
wherein the resistive element is configured such that a ratio between the first lateral component, the second lateral component, and the vertical component within the resistive region is obtained which results in the specific piezo-resistive coefficient.

2. The resistive element according to claim 1, wherein the first lateral direction and the second lateral direction are perpendicular to each other, and wherein the resistive region comprises the same dimension along the first lateral direction and the second lateral direction.

3. A resistive element having a specific piezo-resistive coefficient, wherein the resistive element comprises:
a first resistive region and a second resistive region formed in a semiconductor substrate, wherein the semiconductor substrate comprises a first main surface area, wherein the first resistive region and the second resistive region extend in a lateral direction parallel to the main surface area and in a vertical direction perpendicular to the main surface area, and wherein the first resistive region and the second resistive region are isolated from each other and from the semiconductor substrate in the lateral direction and comprise for a specific stress component a first piezo-resistive coefficient for a current flow in the lateral direction and a second piezo-resistive coefficient, different from the first piezo-resistive coefficient, for a current flow in the vertical direction;
a first contact structure arranged to contact at least a portion of a first face of the first resistive region parallel to the main surface area and positioned at a first distance to the main surface area;
a second contact structure arranged to contact at least a portion of a second face of the first resistive region different from the first face of the first resistive region, parallel to the main surface area and arranged at a second distance to the main surface area different from the first distance;
a third contact structure arranged to contact at least a portion of a first face of the second resistive region parallel to the main surface area and positioned at a third distance to the main surface area;
a fourth contact structure arranged to contact at least a portion of a second face of the second resistive region different from the first face of the second resistive region, parallel to the main surface area and positioned at a fourth distance to the main surface area different from the third distance;
wherein the second contact structure and the fourth contact structure are connected to each other;

wherein the resistive element is configured to generate, in response to an input signal applied to at least one of the first contact structure and second contact structure, a current flow distribution within the first resistive region between the first contact structure and the second contact structure having a lateral component and a vertical component, and to generate, in response to an input signal applied to at least one of the third contact structure and fourth contact structure, a current flow distribution within the second resistive region between the third contact structure and the fourth contact structure having a lateral component and a vertical component;

wherein a combination of the lateral components and the vertical components within the first resistive region and the second resistive region results in a piezo-resistive coefficient of the resistive element which is defined by the ratio between the lateral components in the lateral direction having the first piezo-resistive coefficient for the current flow in the lateral direction and the vertical components in the vertical direction having the second piezo-resistive coefficient for the current flow in the vertical direction; and wherein the resistive element is configured such that a ratio between the lateral components and the vertical components is obtained within the first resistive region and the second resistive region which results in the specific piezo-resistive coefficient.

4. The resistive element according to claim 3, wherein the second contact structure and the third contact structure each comprise a single semi conductive region arranged to contact the second face of the first resistive region and the second face of the second resistive region, wherein a conductivity of the conductive region is at least a factor of ten higher than a conductivity of the first resistive region and the second resistive region.

5. The resistive element according to claim 4, wherein the single semi conductive region is buried in the semiconductor substrate such that it comprises neither the first main surface area of the semiconductor substrate nor a second main surface area of the semiconductor substrate, opposing the first main surface area.

6. A resistive element comprising:
a resistive region formed in a semiconductor substrate; and
contacts;
wherein the semiconductor substrate comprises a main surface area and extends in a first lateral direction parallel to the main surface area, and in a second lateral direction parallel to the main surface area and different from the first lateral direction, and in a vertical direction perpendicular to both of the first lateral direction and the second lateral direction;
wherein the resistive region extends in at least one of the first lateral direction and second lateral direction between lateral boundaries, and in an out-of-plane direction between top and bottom boundaries, wherein the out-of-plane direction is different from all possible linear combinations of the first lateral direction and second lateral direction, wherein the resistive region is isolated along its lateral boundaries from the semiconductor substrate;
wherein the contacts are arranged at least at portions of the top and bottom boundaries of the resistive region;
wherein the resistive region comprises a first piezo-resistive coefficient for a current flow along the first lateral direction and a specific stress component and a second piezo-resistive coefficient for a current flow along the vertical direction and the specific stress component;
wherein at least one of the contacts is configured to generate, in response to an input signal applied to the respective contact, a current vector field within the resistive region; and
wherein the boundary conditions imposed on the current vector field inside the resistive region are such that the resistance between two the contacts comprises a piezo-resistive coefficient value between the values of the first piezo-resistive coefficient and the second piezo-resistive coefficient.

7. The resistive element according to claim 6, wherein the specific stress component is a stress component along the first lateral direction, along the second lateral direction, or along a combination of the first lateral direction and the second lateral direction.

8. The resistive element according to claim 6, wherein a difference between the value of the piezo-resistive coefficient and the value of the second piezo-resistive coefficient is smaller than a difference between the value of the piezo-resistive coefficient and the value of the first piezo-resistive coefficient.

9. The resistive element according to claim 6, wherein a first contact of the contacts forms the top boundary of the resistive region, and wherein a second contact of the contacts forms the bottom boundary of the resistive region.

10. The resistive element according to claim 6, wherein the out-of-plane direction is parallel to the vertical direction.

11. The resistive element according to claim 6, wherein one of the contacts covers the entire top boundary of the resistive region or the entire bottom boundary of the resistive region.

12. The resistive element according to claim 6, wherein the resistive element comprises:
a further resistive region formed in the semiconductor substrate; and
further contacts;
wherein the further resistive region extends in at least one of the first lateral direction and second lateral direction between lateral boundaries, and in an out-of-plane direction between top and bottom boundaries, wherein the out-of-plane direction is different from all possible linear combinations of the first lateral direction and second lateral direction, wherein the further resistive region is isolated along its lateral boundaries from the semiconductor substrate;
wherein the further contacts are arranged at least at portions of the top and bottom boundaries of the further resistive region;
wherein the further resistive region comprises a first piezo-resistive coefficient for a current flow along the first lateral direction and a second piezo-resistive coefficient for a current flow along the vertical direction;
wherein at least one of the further contacts is configured to generate in response to an input signal applied to the respective contact a further current vector field within the further resistive region; and
wherein the boundary conditions imposed on the further current vector field inside the further resistive region are such that the resistance between two of the further contacts comprises a piezo-resistive coefficient value between the values of the first piezo-resistive coefficient and the second piezo-resistive coefficient;
wherein a contact of the contacts which is arranged at the bottom boundary of the resistive region is connected to a further contact of the further contacts which is arranged at the bottom boundary of the further resistive region such that a current applied to the resistive element flows through the resistive region and the further resistive region in a back-to-back manner.

13. The resistive element according to claim 6, wherein the resistive region extends in both of the first lateral direction and the second lateral direction, wherein the resistive region comprises a third piezo-resistive coefficient for a current flow along the second lateral direction;

wherein the boundary conditions imposed on the current vector field inside the resistive region are such that the resistance between the two of the contacts comprises a piezo-resistive coefficient value between the values of the second piezo-resistive coefficient and a mean of the first piezo-resistive coefficient and the third piezo-resistive coefficient.

14. The resistive element according to claim 6, wherein the boundary conditions are set such that only portions of the top boundary of the resistive region are contacted with top contacts of the contacts.

15. The resistive element according to claim 6, wherein the boundary conditions are set such that at least portions of the lateral boundaries of the resistive region force vertical current streamlines to take bends into lateral directions.

16. A sensor system for providing a mechanical stress compensated sensor signal, comprising:

a Hall effect device; and a resistive element comprising a resistive region, a first contact structure and a second contact structure;

wherein the Hall effect device and the resistive region of the resistive element are formed in the same semiconductor substrate, wherein the semiconductor substrate comprises a first main surface area, wherein the resistive region extends in a lateral direction parallel to the main surface area and in a vertical direction perpendicular to the main surface area, and wherein the resistive region is isolated from the semiconductor substrate in the lateral direction and comprises for a specific stress component a first piezo-resistive coefficient for a current flow in the lateral direction and a second piezo-resistive coefficient, different from the first piezo-resistive coefficient, for a current flow in the vertical direction;

a first contact structure arranged to contact at least a portion of a first face of the resistive region parallel to the main surface area and positioned at a first distance to the main surface area;

a second contact structure arranged to contact at least a portion of a second face of the resistive region different from the first face, parallel to the main surface area and positioned at a second distance to the main surface area different from the first distance;

wherein the resistive element is configured to generate in response to an input signal applied to at least one of the first contact structure and the second contact structure a current flow distribution within the resistive region between the first contact structure and the second contact structure, the current flow distribution having a lateral component and a vertical component;

wherein a combination of the lateral component and the vertical component results in a piezo-resistive coefficient of the resistive element which is defined by the ratio between the lateral component in the lateral direction in the resistive region having the first piezo-resistive coefficient for the current flow in the lateral direction and the vertical component in the vertical direction in the resistive region having the second piezo-resistive coefficient for the current flow in the vertical direction;

wherein the resistive element is configured such that a ratio between the lateral component and the vertical component is obtained within the resistive region which results in the specific piezo-resistive coefficient;

wherein the system is configured to generate a mechanical stress dependent signal by using the resistive element, wherein the mechanical stress dependent signal comprises a specific mechanical stress dependency which is defined by the specific piezo-resistive coefficient of the resistive element; and wherein the system is configured to provide the mechanical stress compensated sensor signal by using the Hall effect device and the mechanical stress dependent signal.

17. The system according to claim 16, wherein a conductivity of the resistive region of the resistive element and a conductivity of an active region of the Hall effect device were defined during manufacturing by the same process step.

18. The system according to claim 17, wherein the resistive element and an active region of the Hall effect device are exposed to substantially the same mechanical stress along the lateral direction.

19. The system according to claim 16, wherein the Hall effect device is a Hall plate.

* * * * *